US009287423B2

(12) United States Patent
Mori et al.

(10) Patent No.: US 9,287,423 B2
(45) Date of Patent: Mar. 15, 2016

(54) SOLID-STATE IMAGING DEVICE AND METHOD OF MANUFACTURING THE SOLID-STATE IMAGING DEVICE

(71) Applicants: PANASONIC CORPORATION, Osaka (JP); Ikuo Terauchi, Osaka (JP)

(72) Inventors: Mitsuyoshi Mori, Kyoto (JP); Toru Okino, Osaka (JP); Motonori Ishii, Osaka (JP); Shigeru Saitou, Kyoto (JP); Yusuke Otake, Toyama (JP); Kazuo Fujiwara, Toyama (JP); Yasuhiro Shimada, Kyoto (JP); Yutaka Hirose, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 13/675,426

(22) Filed: Nov. 13, 2012

(65) Prior Publication Data
US 2013/0134536 A1 May 30, 2013

Related U.S. Application Data

(63) Continuation of application No. PCT/JP2011/000873, filed on Feb. 17, 2011.

(30) Foreign Application Priority Data

May 14, 2010 (JP) ................................. 2010-112658
Aug. 4, 2010 (JP) ................................. 2010-175785

(51) Int. Cl.
*H01L 31/0232* (2014.01)
*H01L 27/146* (2006.01)
*H01L 31/18* (2006.01)

(52) U.S. Cl.
CPC ...... *H01L 31/02325* (2013.01); *H01L 27/1462* (2013.01); *H01L 27/1463* (2013.01);

(Continued)

(58) Field of Classification Search
CPC .................... H01L 27/14623; H01L 27/14621
USPC ............... 257/432, 436, E31.127; 438/70, 72
See application file for complete search history.

(56) References Cited

U.S. PATENT DOCUMENTS 5,172,206 A * 12/1992 Iizuka ........................... 257/291
5,493,143 A * 2/1996 Hokari ........................... 257/432
(Continued)

FOREIGN PATENT DOCUMENTS

CN          1763963          4/2006
CN          101079967        11/2007
(Continued)

OTHER PUBLICATIONS

International Search Report issued Mar. 29, 2011 in International Application No. PCT/JP2011/000873.
(Continued)

*Primary Examiner* — Victoria K Hall
(74) *Attorney, Agent, or Firm* — Wenderoth, Lind & Ponack, L.L.P.

(57) ABSTRACT

A solid-state imaging device in which a plurality of pixels are two-dimensionally arranged includes a silicon layer; a plurality of photodiodes which are formed in the silicon layer to correspond to the pixels and generate signal charges by performing photoelectric conversion on incident light; and a plurality of color filters formed above the silicon layer to correspond to the plurality of the pixels. A protrusion is formed in a region on a side of the silicon layer between adjacent ones of the color filters wherein the protrusion has a refractive index lower than refractive indices of the adjacent ones of the color filters and, each of the color filters is in contact with the adjacent ones of the color filters, above the protrusion.

17 Claims, 13 Drawing Sheets

(52) U.S. Cl.
CPC ...... *H01L27/1464* (2013.01); *H01L 27/14621* (2013.01); *H01L 27/14623* (2013.01); *H01L 27/14687* (2013.01); *H01L 31/18* (2013.01)

(56) References Cited

U.S. PATENT DOCUMENTS

| | | | | |
|---|---|---|---|---|
| 5,514,888 | A * | 5/1996 | Sano et al. | 257/232 |
| 5,614,950 | A * | 3/1997 | Park et al. | 348/315 |
| 5,654,565 | A * | 8/1997 | Hokari | 257/222 |
| 5,844,290 | A * | 12/1998 | Furumiya | 257/432 |
| 6,066,511 | A * | 5/2000 | Fukusyo | 438/60 |
| 6,081,018 | A * | 6/2000 | Nakashiba et al. | 257/435 |
| 7,157,331 | B2 * | 1/2007 | Lu et al. | 438/257 |
| 7,285,438 | B2 | 10/2007 | Kasuga | |
| 7,285,808 | B2 | 10/2007 | Kasuga | |
| 7,411,620 | B2 * | 8/2008 | Taniguchi et al. | 348/294 |
| 7,470,965 | B2 | 12/2008 | Kuriyama | |
| 7,683,302 | B2 | 3/2010 | Yokozawa | |
| 7,759,755 | B2 * | 7/2010 | Adkisson et al. | 257/436 |
| 7,847,361 | B2 * | 12/2010 | Kokusenya | 257/435 |
| 7,935,988 | B2 * | 5/2011 | Takeda et al. | 257/233 |
| 7,989,752 | B2 | 8/2011 | Yokozawa | |
| 8,003,425 | B2 * | 8/2011 | Adkisson et al. | 438/65 |
| 8,134,110 | B2 | 3/2012 | Yokozawa | |
| 8,138,534 | B2 * | 3/2012 | Adkisson et al. | 257/292 |
| 8,139,131 | B2 * | 3/2012 | Komatsu et al. | 348/294 |
| 8,183,603 | B2 | 5/2012 | Yamaguchi et al. | |
| 8,325,254 | B2 | 12/2012 | Yanagita et al. | |
| 8,350,952 | B2 * | 1/2013 | Meisenzahl | 348/340 |
| 8,378,440 | B2 * | 2/2013 | Kwon et al. | 257/432 |
| 8,390,089 | B2 * | 3/2013 | Chen et al. | 257/447 |
| 8,415,725 | B2 * | 4/2013 | Hirota | 257/291 |
| 8,471,314 | B2 | 6/2013 | Maruyama et al. | |
| 8,492,804 | B2 | 7/2013 | Yamaguchi et al. | |
| 8,502,130 | B2 * | 8/2013 | Tay et al. | 250/214.1 |
| 2001/0054677 | A1 * | 12/2001 | Nakashima | 250/208.1 |
| 2002/0058350 | A1 * | 5/2002 | Kim | 438/29 |
| 2004/0147059 | A1 * | 7/2004 | Jeong et al. | 438/70 |
| 2005/0051817 | A1 * | 3/2005 | Morita et al. | 257/294 |
| 2005/0056901 | A1 | 3/2005 | Kuriyama | |
| 2005/0077588 | A1 | 4/2005 | Kasuga | |
| 2005/0139945 | A1 * | 6/2005 | Lim | 257/432 |
| 2005/0141104 | A1 * | 6/2005 | Hong | 359/727 |
| 2005/0258462 | A1 * | 11/2005 | Min | 257/292 |
| 2006/0077268 | A1 * | 4/2006 | Yokozawa | 348/272 |
| 2006/0113622 | A1 * | 6/2006 | Adkisson et al. | 257/443 |
| 2006/0125036 | A1 | 6/2006 | Kasuga | |
| 2006/0158547 | A1 * | 7/2006 | Komatsu et al. | 348/340 |
| 2006/0180885 | A1 * | 8/2006 | Rhodes | 257/432 |
| 2006/0183265 | A1 * | 8/2006 | Oh et al. | 438/199 |
| 2007/0037338 | A1 * | 2/2007 | Kim | 438/199 |
| 2007/0040194 | A1 * | 2/2007 | Misawa | 257/291 |
| 2007/0096232 | A1 * | 5/2007 | Hwang | 257/431 |
| 2007/0103572 | A1 * | 5/2007 | Yokozawa | 348/272 |
| 2007/0132921 | A1 * | 6/2007 | Yoon | 349/107 |
| 2007/0187787 | A1 * | 8/2007 | Ackerson et al. | 257/428 |
| 2007/0210395 | A1 | 9/2007 | Maruyama et al. | |
| 2008/0054311 | A1 | 3/2008 | Kasuga | |
| 2008/0257497 | A1 * | 10/2008 | Shimaoka et al. | 156/345.29 |
| 2008/0303108 | A1 * | 12/2008 | Kasano et al. | 257/432 |
| 2009/0085137 | A1 | 4/2009 | Kuriyama | |
| 2009/0096049 | A1 * | 4/2009 | Oshiyama et al. | 257/432 |
| 2009/0152605 | A1 * | 6/2009 | Ohno et al. | 257/294 |
| 2009/0189055 | A1 * | 7/2009 | Lin et al. | 250/208.1 |
| 2009/0200622 | A1 * | 8/2009 | Tai et al. | 257/432 |
| 2009/0242948 | A1 * | 10/2009 | Barrett et al. | 257/291 |
| 2009/0261440 | A1 * | 10/2009 | Kawasaki | 257/432 |
| 2009/0283807 | A1 * | 11/2009 | Adkisson et al. | 257/292 |
| 2009/0298220 | A1 * | 12/2009 | Anderson et al. | 438/70 |
| 2010/0060769 | A1 * | 3/2010 | Inuiya | 348/311 |
| 2010/0066876 | A1 * | 3/2010 | Kurihara | 348/273 |
| 2010/0110271 | A1 | 5/2010 | Yanagita et al. | |
| 2010/0134663 | A1 | 6/2010 | Yokozawa | |
| 2010/0140733 | A1 * | 6/2010 | Lee et al. | 257/447 |
| 2010/0141816 | A1 | 6/2010 | Maruyama et al. | |
| 2010/0201834 | A1 * | 8/2010 | Maruyama et al. | 348/222.1 |
| 2010/0207225 | A1 * | 8/2010 | Masuda | 257/432 |
| 2010/0230578 | A1 * | 9/2010 | Horikoshi et al. | 250/208.1 |
| 2010/0237451 | A1 * | 9/2010 | Murakoshi | 257/432 |
| 2010/0245637 | A1 * | 9/2010 | Itonaga | 348/273 |
| 2010/0253819 | A1 * | 10/2010 | Yokozawa | 348/273 |
| 2010/0317142 | A1 * | 12/2010 | Tay et al. | 438/70 |
| 2011/0031381 | A1 * | 2/2011 | Tay et al. | 250/226 |
| 2011/0058062 | A1 | 3/2011 | Maruyama et al. | |
| 2011/0074960 | A1 * | 3/2011 | Nagata | 348/164 |
| 2011/0074991 | A1 * | 3/2011 | Sakoh | 348/279 |
| 2011/0102651 | A1 * | 5/2011 | Tay | 348/280 |
| 2011/0108715 | A1 * | 5/2011 | Chen et al. | 250/227.2 |
| 2011/0108938 | A1 * | 5/2011 | Nozaki et al. | 257/432 |
| 2011/0233704 | A1 | 9/2011 | Yokozawa | |
| 2012/0147241 | A1 | 6/2012 | Yamaguchi et al. | |

FOREIGN PATENT DOCUMENTS

| | | |
|---|---|---|
| JP | 2001-237405 | 8/2001 |
| JP | 2003-115581 | 4/2003 |
| JP | 2005-86186 | 3/2005 |
| JP | 2006-128433 | 5/2006 |
| JP | 2006-295125 | 10/2006 |
| JP | 2009-80313 | 4/2009 |
| JP | 2009-88415 | 4/2009 |
| JP | 2009-111225 | 5/2009 |
| JP | 2010-109295 | 5/2010 |

OTHER PUBLICATIONS

Office Action with Search Report issued Sep. 24, 2014 in corresponding Chinese Patent Application No. 201180023800.X with partial English Translation.

* cited by examiner

SOLID-STATE IMAGING DEVICE AND METHOD OF MANUFACTURING THE SOLID-STATE IMAGING DEVICE

CROSS REFERENCE TO RELATED APPLICATIONS

This is a continuation application of PCT International Application No. PCT/JP2011/000873 filed on Feb. 17, 2011, designating the United States of America, which is based on and claims priorities of Japanese Patent Application No. 2010-112658 filed on May 14, 2010 and Japanese Patent Application No. 2010-175785 filed on Aug. 4, 2010. The entire disclosures of the above-identified applications, including the specifications, drawings and claims are incorporated herein by reference in their entirety.

FIELD

The present invention relates to solid-state imaging devices in which pixel units including photoelectric conversion units are arranged in a matrix array, and also relates to methods of manufacturing the solid-state imaging device.

BACKGROUND

Recent years have seen downsizing of camera modules. With this, the distance between lens and a solid-state imaging device is becoming smaller. As such, the angle of incident light, especially toward an outer perimeter of light-receiving region, causes deterioration in sensitivity characteristic and color mixture characteristic.

In view of the above, as a countermeasure for such deterioration in characteristics, a technique of forming a cavity or a low refractive index material between color filters has been presented as described in Patent Literatures (PTLs) 1, 2 and 3.

For example, FIG. 13 is a cross-sectional view showing a configuration of a conventional solid-state imaging device described in PTL 1. In the solid-state imaging device shown in FIG. 13, a hollow area 315 (having a refractive index of 1) is provided between adjacent color filters 309, and a cap layer 317 which seals the hollow area 315 is formed.

Furthermore, in the solid-state imaging device shown in FIG. 13 a photodiode 301 is formed in a silicon substrate. On the front surface side of the silicon substrate, multilayered wiring 306 is formed via an interlayer insulating film 305. In addition, on a surface of the upper most layer (corresponding to a lowermost layer in FIG. 13) of the multilayered wiring 306, a supporting substrate 310 is bonded via an adhesive layer 308. Furthermore, the photodiode 301 in the silicon substrate is isolated by an isolation region 319. In addition, on the back surface side of the silicon substrate, a color filter 309 is formed above the photodiode 301. The hollow area 315 is formed between the color filters 309.

The hollow area 315 is formed above the isolation region 319 by self-alignment. When oblique incident light enters each of pixels, most of the light reaching a side surface of the color filter 309 is reflected off because of the large difference between a refractive index of the color filter 309 and a refractive index of the hollow area 315, and light is collected onto the photodiode 301. Therefore, it is possible to improve the sensitivity characteristic and the color mixture characteristic.

CITATION LIST

Patent Literature

[PTL 1]
Japanese Unexamined Patent Application Publication No. 2009-88415
[PTL 2]
Japanese Unexamined Patent Application Publication No. 2009-111225
[PTL 3]
Japanese Unexamined Patent Application Publication No. 2006-295125

SUMMARY

However, with the above-described conventional technology, a cap layer is buried in a cavity unevenly. This causes variation in sensitivity characteristic among pixels. Furthermore, problems occurs such as: cross talk which occurs when incident light passing through the cavity reaches an adjacent pixel; and flare that occurs when incident light passing through the cavity is reflected off a light blocking metal.

For example, the configuration described in above-described PTL 1 and PTL 3 requires the cap layer above the color filter. When depositing the cap layer, because a cavity exists between the color filters, part of a cap layer material is buried in the cavity in principle. The cap layer material buried unevenly in a cavity leads to irregularity in sensitivity characteristic among pixels. This causes a problem of occurrence of variation to the sensitivity characteristic among pixels and chips.

Furthermore, in the configuration described in PTLs 1 to 3, as described above, a low refractive index material or a cavity is formed between the color filters. Thus, the light which falls between the color filters reaches a silicon substrate surface or light-blocking wiring.

When the incident light reaches the silicon substrate surface, a problem of color mixture occurs due to the cross talk of incident light to an adjacent pixel. Furthermore, when the incident light reaches the light-blocking wiring, light reflects off at the surface of the light-blocking wiring. Due to this, flare which is prominent particularly at high light intensity is generated, causing a problem of deterioration of picture quality.

The present invention has been conceived in view of the above-described problems and has objectives to provide a solid-state imaging device and a method of manufacturing a solid-state imaging device which make it possible to achieve downsizing of a camera module and miniaturization of a size of a pixel while achieving high sensitivity, reducing color mixture, and increasing picture quality.

In order to solve the problem described above, a solid-state imaging device according to an aspect of the present invention is a solid-state imaging device in which a plurality of pixels are two-dimensionally arranged, the solid-state imaging device includes: a semiconductor substrate; a plurality of photoelectric conversion units formed in the semiconductor substrate to correspond to the pixels and configured to generate signal charges by performing photoelectric conversion on incident light; and a plurality of color filters formed above the semiconductor substrate to correspond to the plurality of the pixels, wherein a low-refractive index region is formed in a region on a side of the semiconductor substrate between adjacent ones of the color filters, the low-refractive index region having a refractive index lower than refractive indices of the adjacent ones of the color filters, and each of the color filters is in contact with the adjacent ones of the color filters, above the low-refractive index region.

With this, even when the oblique incident light is at high incident angle, most of the light is reflected off due to the difference in respective refractive indices at a boundary between a side surface of the color filter and the low-refractive index region. Therefore, it is possible to reduce leakage of light into the adjacent pixels and collect a large amount of light. Thus, it is possible to achieve high sensitivity and reduce color mixture. Furthermore, above the low-refractive index region is covered by the color filter. Thus, even when the lens is formed above the low-refractive index region, variation in shape of the low-refractive index region which is formed between the color filters can be reduced. In addition, most of the light reflected off the surface of the semiconductor substrate is absorbed by the color filter above the low-refractive index region which is formed between the color filters. Thus, even when light intensity is high, it is possible to reduce flare and achieve high picture quality.

Furthermore, the low-refractive index region may be a cavity or a region including a material which has a refractive index lower than the refractive indices of the adjacent ones of the color filters.

With this, the light which entered the color filter is reflected at the boundary between the color filter and the low-refractive index region. Thus, it is possible to reduce light which leaks into the adjacent pixels, and achieve high sensitivity.

Furthermore, the low-refractive index region may include a silicon oxide which has a refractive index lower than the refractive indices of the adjacent ones of the color filters.

With this, for example, the low-refractive index region can be easily formed by etching a silicon oxide film which is formed as a planarization film below the color filter.

Furthermore, the solid-state imaging device may further include a first light-blocking portion which is formed in the low-refractive index region and blocks light.

With this, the first light-blocking portion obstructs the incident light which leaked into the low-refractive index region from reaching the semiconductor substrate. Thus, it is possible to reduce light which leaks into adjacent pixels, and achieve high sensitivity. Furthermore, the light which reflected off the first light-blocking portion is absorbed by the color filter above the low-refractive index region. Thus, it is possible to reduce flare, and achieve high picture quality even when the light intensity is high. In addition, the distance between the color filter and the photoelectric conversion unit is reduced. Thus, it is possible to achieve high sensitivity.

Furthermore, the first light-blocking portion may include at least one of tungsten, aluminum, copper, and titanium.

With this, light which entered the low-refractive index region is obstructed from reaching inside of the semiconductor substrate. Thus, it is possible to prevent the incident light from entering the semiconductor substrate, reduce leakage of light into adjacent pixels, and achieve high sensitivity. In addition, the first light-blocking portion can be a thin-film. Thus, the distance between the color filter and the photoelectric conversion unit is reduced and high sensitivity can be achieved.

Furthermore, the solid-state imaging device may further include an isolation portion which is formed between the photoelectric conversion units and includes a plurality of impurity regions of a conductivity type different from a conductivity type of the photoelectric conversion units, wherein a width of a surface of the low-refractive index region on a side of the semiconductor substrate is smaller than a width of a surface of the isolation portion on a side of the color filters.

With this, the light which entered the color filter reaches the photoelectric conversion unit without leaking into the isolation portion in the semiconductor substrate. Thus, it is possible to achieve high sensitivity.

Furthermore, the solid-state imaging device may further include a second light-blocking portion which is formed between the low-refractive index region and the semiconductor substrate and blocks light.

With this, the light which entered the low-refractive index region does not enter the semiconductor substrate. Therefore, the light which has not been dispersed by the color filter is not accumulated in the photoelectric conversion unit. Thus, sensitivity of each color is improved. Furthermore, it is possible to prevent the light which entered the low-refractive index region from entering the semiconductor substrate, and reduce light which leaks into adjacent pixels.

Furthermore, the solid-state imaging device may further include a high-refractive index film which is formed between the low-refractive index region and the semiconductor substrate and has a refractive index higher than the refractive indices of the adjacent ones of the color filters.

With this, light collection efficiency can be further increased. Thus, it is possible to achieve high sensitivity.

Furthermore, the high-refractive index film may include at least one of a titanium oxide, a silicon nitride, and a tantalum oxide.

With this, it is possible to increase sensitivity while ensuring moisture resistance.

Furthermore, the solid-state imaging device may further include a plurality of lenses formed above the color filters to correspond to the pixels.

With this, light collection efficiency improves. Thus, it is possible to increase sensitivity.

Furthermore, the solid-state imaging device may further include detection circuits which are formed below the semiconductor substrate and detect the signal charges generated by the photoelectric conversion units.

With this, the distance between the color filter and the photoelectric conversion unit is reduced. Thus, it is possible to increase sensitivity and reduce color mixture.

Furthermore, a method of manufacturing a solid-state imaging device according to an aspect of the present invention is a method of manufacturing a solid-state imaging device in which a plurality of pixels are two-dimensionally arranged, the method includes: forming a plurality of photoelectric conversion units in a semiconductor substrate to correspond to the pixels, the photoelectric conversion units generating signal charges by performing photoelectric conversion on incident light; forming, above the semiconductor substrate, a low-refractive index region having a refractive index lower than refractive indices of a plurality of color filters; and forming the color filters above the semiconductor substrate to correspond to the pixels, wherein, in the forming of a low-refractive index region, the low-refractive index region is formed in a region on a side of the semiconductor substrate between adjacent ones of the color filters, and, in the forming of the color filters, the color filters are formed so that the adjacent ones of the color filters are in contact with each other above the low-refractive index region.

With this, even when the oblique incident light is at a high incident angle, most of the light is reflected off due to the difference in respective refractive indices at the boundary between a side surface of the color filter and the low-refractive index region. Therefore, it is possible to reduce light which leaks into adjacent pixels and manufacture a solid-state imaging device with high sensitivity and low color mixture. Furthermore, the color filter covers and is located above the low-refractive index region. Thus, even when the lens is formed above the low-refractive index region, variation in shape of the low-refractive index region which is formed between the color filters can be reduced. In addition, most of the light which reflected off the surface of the semiconductor substrate is absorbed by the color filter above the low-refractive index region which is formed between the color filters. Thus, it is possible to reduce flare and manufacture a solid-state imaging device with high picture quality even when the light intensity is high.

Furthermore, the method may further include: forming a light-blocking portion which blocks light, in a region which is located above the semiconductor substrate and includes at least part of a boundary between the pixels, and in the forming of a low-refractive index region, the low-refractive index region is formed above the semiconductor substrate so as to include the light-blocking portion; and the color filters may be formed above the semiconductor substrate to correspond to the pixels.

With this, the light-blocking portion obstructs light which leaked into the low-refractive index region from reaching the semiconductor substrate. Thus, it is possible to reduce leakage of light into adjacent pixels, and achieve high sensitivity. Furthermore, the light which reflected off the light-blocking portion is absorbed by the color filter above the low-refractive index region. Thus, it is possible to reduce flare and achieve high picture quality, even when the light intensity is high. In addition, the distance between the color filter and the photoelectric conversion unit is reduced. Thus, it is possible to achieve high sensitivity.

Furthermore, the forming of a low-refractive index region may include: forming, above the semiconductor substrate, a material having a refractive index lower than refractive indices of the adjacent ones of the color filters, and forming the low-refractive index region by patterning and etching the formed material.

With this, for example, the low-refractive index region can be easily formed by etching a silicon oxide film which is formed as a planarization film below the color filter.

Furthermore, the forming of a low-refractive index region may include: forming silicon above the semiconductor substrate; forming, in a region between the adjacent ones of the color filters, a protrusion including the silicon by patterning and etching the formed silicon; forming, after the forming of the color filters, a hole in the adjacent color filters so that the hole reaches the protrusion; and forming the low-refractive index region which is a cavity by removing the protrusion through exposure, via the hole, of the protrusion to a gas for removing silicon.

With this, it is possible to form cavities with less variation in shape. Thus, it is possible to manufacture a solid-state imaging device with high sensitivity.

According to the present invention, it is possible to achieve downsizing of a camera module and miniaturization of a size of a pixel while achieving high sensitivity, reducing color mixture and increasing picture quality.

BRIEF DESCRIPTION OF DRAWINGS

These and other objects, advantages and features of the invention will become apparent from the following description thereof taken in conjunction with the accompanying drawings that illustrate a specific embodiment of the present invention.

DETAILED DESCRIPTION OF INVENTION

The following describes in detail with reference to drawings a solid-state imaging device and a method of manufacturing a solid-state imaging device according to embodiments of the present invention. It should be noted that the present invention is not limited to the following embodiments. Furthermore, modification can be made as appropriate in a scope without departing from the scope which produces an advantageous effect of the present invention. Further, an embodiment can be combined with another embodiment.

Embodiment 1

A solid-state imaging device according to Embodiment 1 of the present invention is a solid-state imaging device in which a plurality of pixels are two-dimensionally arranged, and the solid-state imaging device includes: a plurality of color filters formed above a first main surface of the semiconductor substrate to correspond to the plurality of the pixels, wherein a low-refractive index region is formed in a region on a side of the semiconductor substrate between adjacent ones of the color filters, the low-refractive index region having a refractive index lower than refractive indices of the adjacent ones of the color filters and, each of the color filters is in contact with the adjacent ones of the color filters, above the low-refractive index region.

Figure 1:
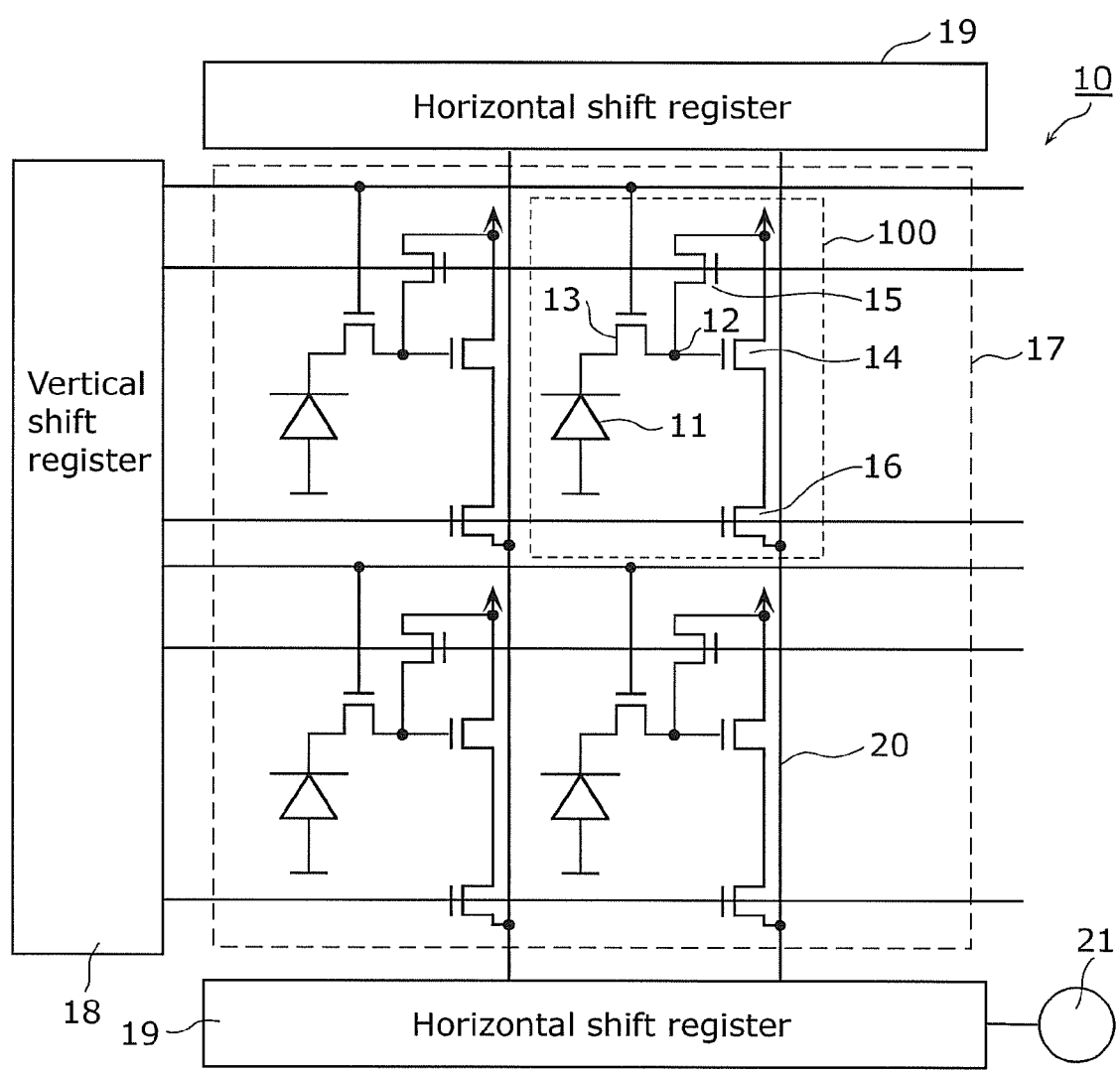
FIG. 1 is a circuit configuration diagram showing an example of a solid-state imaging device according to Embodiment 1 of the present invention.

First, an example of a circuit configuration of a solid-state imaging device according to Embodiment 1 of the present invention is described with reference to FIG. 1. FIG. 1 is a circuit configuration diagram showing an example of a solid-state imaging device 10 according to Embodiment 1 of the present invention.

The solid-state imaging device 10 according to Embodiment 1 of the present invention is, as shown in FIG. 1, a metal oxide semiconductor (MOS) solid-state imaging device in which a plurality of pixel units 100 are arranged in a matrix array. As shown in FIG. 1, the solid-state imaging device 10 includes an imaging area 17, a vertical shift register 18, a horizontal shift register 19, and an output terminal 21.

In the imaging area 17, the plurality of pixel units 100 are arranged in a matrix array. Each of the plurality of pixel units 100 includes: a photoelectric conversion unit (photodiode) 11, a floating diffusion 12, a transfer transistor 13, an amplifier transistor 14, a reset transistor 15, and a selection transistor 16.

The photoelectric conversion unit 11 generates signal charges by performing a photoelectric conversion on incident light. The signal charges generated by the photoelectric conversion unit 11 are transferred to the floating diffusion 12 by the transfer transistor 13.

The electric charges transferred to the floating diffusion 12 is amplified by the amplifier transistor 14, and outputted from the output terminal 21 by the horizontal shift register 19 via the selection transistor 16, which is controlled by the vertical shift register 18, and an output signal line 20.

It should be noted that excess charges accumulated in the floating diffusion 12 is drained by the reset transistor 15 which has a drain region connected to a power line.

Although not shown in FIG. 1, one of a green filter through which green light is transmitted, a red filter through which red light is transmitted, and a blue filter through which blue light is transmitted is formed above each photodiode for each of the pixels. Furthermore, an on-chip microlens is formed above each of the filters in order to improve light collection efficiency.

Subsequently, an example of a cross-sectional configuration of the pixel unit 100 included in the solid-state imaging device 10 according to Embodiment 1 of the present invention is described with reference to FIG. 2.

Figure 2:
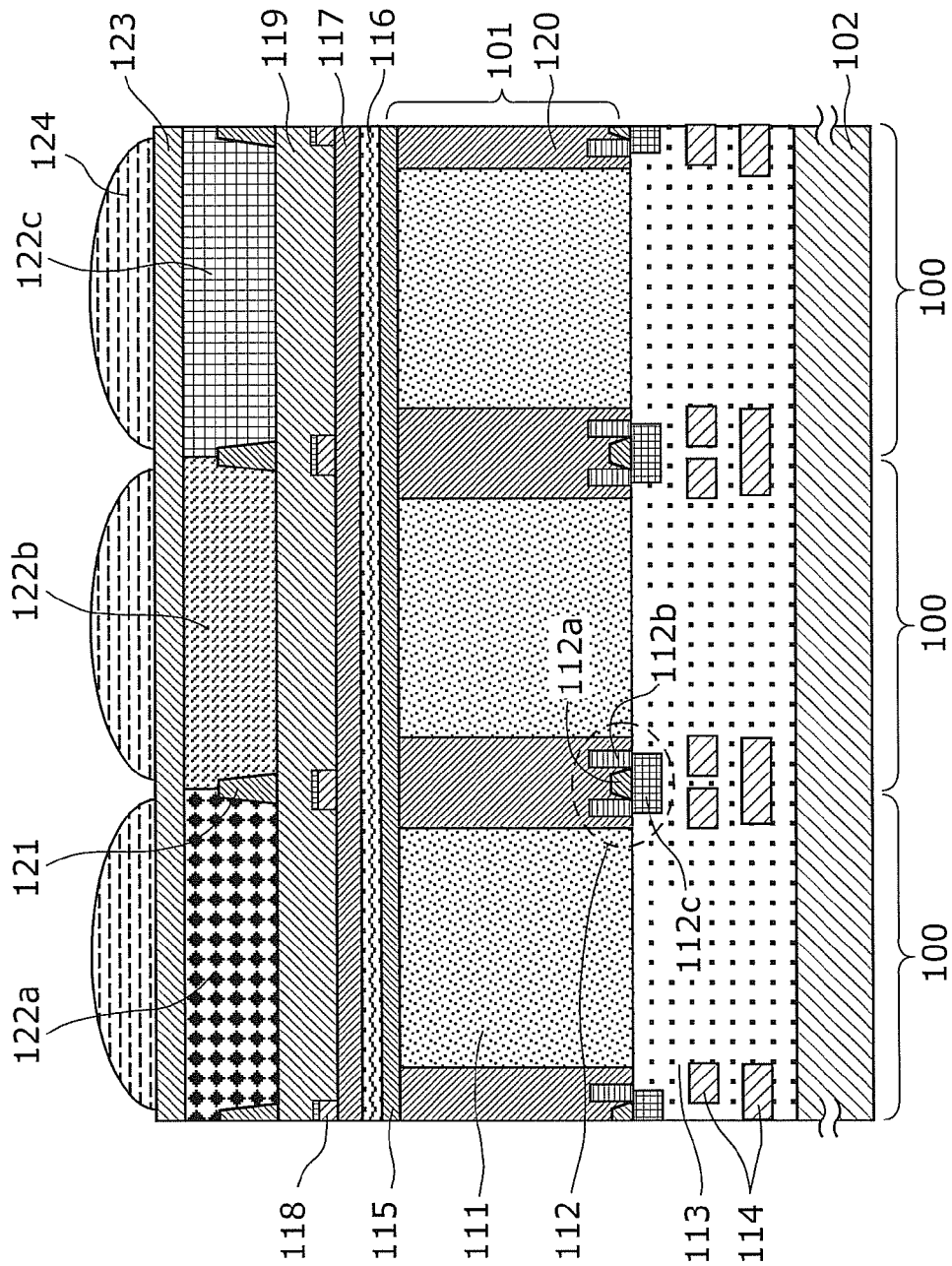
FIG. 2 is a cross-sectional view showing an example of a configuration of a pixel unit according to Embodiment 1 of the present invention.

FIG. 2 is a cross-sectional view showing an example of a configuration of the pixel unit 100 according to Embodiment 1 of the present invention.

The solid-state imaging device 10 according to Embodiment 1 of the present invention includes: a semiconductor substrate having the first main surface (light incidence surface) and a second main surface opposite to the first main face; and a plurality of photoelectric conversion units which are formed in the semiconductor substrate to correspond to the pixels and generate signal charges by performing photoelectric conversion on light which entered from the first main surface.

Furthermore, the solid-state imaging device 10 includes detection circuits which are formed on the second main surface side of the semiconductor substrate and detect signal charges generated by the photoelectric conversion units. The detection circuit includes a transistor 112 and multilayered wiring 114. The solid-state imaging device 10 further includes an isolation portion which electrically isolates: the adjacent ones of the photoelectric conversion units from each other; and the photoelectric conversion units and the detection circuits.

Specifically, as shown in FIG. 2, formed in a silicon layer 101 which is an example of the semiconductor substrate are: a photodiode 111 which includes an n-type (first conductivity type) diffusion region; and the transistor 112 which reads out electric charges accumulated in the photodiode 111.

It should be noted that the transistor 112 is a transistor included in the pixel unit 100 and is, for example, the transfer transistor 13, the amplifier transistor 14, or the selection transistor 16. In FIG. 2, as an example, the transfer transistor 13 is shown as the transistor 112. In this manner, in the example shown in FIG. 2, the detection circuit including at least one of the various transistors is formed below the semiconductor substrate.

The photodiode 111 is an example of the photoelectric conversion unit, and extends from the surface to the back surface of the silicon layer 101. An isolation region 120 is formed between the adjacent photodiodes 111 in a set pattern. The isolation region 120 is an example of the isolation portion and includes, for example, an insulating material, such as a silicon oxide. It should be noted that the photodiode 111 corresponds to the photoelectric conversion unit 11 shown in FIG. 1.

It should be noted that the first main surface of the semiconductor substrate is a light incidence surface that is a surface through which the light incidents on the photodiode 111, which is a top surface of the silicon layer 101 in FIG. 2. Furthermore, the second main surface of the semiconductor substrate is a surface opposite to the light incidence surface, which is a bottom surface of the silicon layer 101 in FIG. 2.

The transistor 112 has a MOS configuration and includes: a shallow trench isolation (STI) region 112b including an insulating film, which is formed to surround a diffusion region 112a; and a gate electrode 112c formed below the diffusion region 112a via a gate oxide film (not shown).

A multilayer insulating film (including a silicon oxide film and a silicon nitride film) 113 is formed below the gate electrode 112c, and the multilayered wiring 114 is formed in the insulating film 113. The transistor 112 is controlled via the multilayered wiring 114. The solid-state imaging device 10 according to Embodiment 1 of the present invention extracts from the surface opposite to the light incidence surface, as an electric signal, the signal charges generated by the photodiode 111.

In addition, a supporting substrate 102 is bonded below the multilayer insulating film 113. The silicon layer 101 is a thin layer having a thickness of, for example, 1 to 5 μm. Thus, the supporting substrate 102 is, for example, a silicon substrate and serves as a reinforcing member for the silicon layer 101 and the like. With this, it is possible to increase the strength of the solid-state imaging device 10.

Furthermore, the solid-state imaging device 10 according to Embodiment 1 of the present invention further includes, on the first main surface side that is above the semiconductor substrate, a plurality of color filters 122a to 122c which are formed to correspond to the pixels. In a region including a boundary between adjacent color filters, each of the color filters 122a to 122c is in contact with adjacent ones of the color filters in the region on the side opposite to the semiconductor substrate. Stated differently, each of the color filters 122a to 122c is in contact with the adjacent color filters in the corresponding region which is between the adjacent color filters and is on the side opposite to the semiconductor substrate. Furthermore, in a region on the side of the semiconductor substrate including the boundary between the adjacent color filters, a low-refractive index region having a refractive index lower than refractive indices of the adjacent color filters 122a to 122c is formed. Stated differently, in a region on the side of the semiconductor substrate between the adjacent color filters, the low-refractive index region having a lower refractive index than the color filters 122a to 122c is formed.

Specifically, a silicon nitride film 116 that is an example of a high-refractive index film having a higher refractive index than the color filters 122a to 122c is formed to have a thickness of 5 to 100 nm, above the first main surface via a silicon oxide film 115. The first main surface is located opposite to the second main surface which is of a surface of the silicon layer 101 and is the side on which the transistor 112 is formed.

With the silicon nitride film 116, intensity of light incident on the photodiode 111 increases, and sensitivity to green (550 nm) light increases by approximately 20%. As described, a high-refractive index film having higher refractive index than the color filters 122a to 122c may be included between the low-refractive index region and the semiconductor substrate.

It should be noted that, instead of the silicon nitride film 116, a high-refractive index film including at least one of a titanium oxide ($TiO_2$) and a tantalum oxide (TaO) may be included.

Furthermore, a silicon oxide film 117 is formed above the silicon nitride film 116 and, above the silicon oxide film 117, a metal film 118 that is an example of a second light-blocking portion which blocks light is formed in a grid. In Embodiment 1 of the present invention, a tungsten material having high light-blocking capability as a thin-film is used as a material of the metal film 118. It should be noted that aluminum or copper may be used as a material of the metal film 118. Furthermore, the metal film 118 has a thickness of 200 to 500 nm. The metal film 118 is formed between the first main surface and an after-mentioned protrusion 121 that is an example of the low-refractive index region.

Located above the metal film 118 is an insulating film 119 which includes a silicon oxide film. The insulating film 119 has a thickness of 300 to 2000 nm.

Further, the protrusion 121 having a lower refractive index than the color filters 122a to 122c is formed above the insulating film 119. Specifically, the protrusion 121 is formed above the isolation region 120. In other words, the protrusion 121 is formed along the boundary between the pixels. For example, the protrusion 121 is formed in a grid and has a height of 100 to 500 nm.

Further, a corresponding one of the color filters 122a to 122c is formed between the protrusions 121 above the photodiodes 111. Stated differently, the protrusion 121 is formed in a region between the adjacent color filters 122a to 122c. In other words, in the region including the boundary between the adjacent color filters 122a to 122c, the protrusion 121 that is an example of the low-refractive index region is formed on a side of the semiconductor substrate.

Furthermore, the protrusion 121 is covered by the color filters 122a to 122c. Above the protrusion 121, a boundary of adjacent color filters which correspond to adjacent pixels is provided. Specifically, in a region including a boundary between adjacent ones of the color filters 122a to 122c, the adjacent color filters are in contact with each other in the region opposite to the semiconductor substrate. Stated differently, as shown in FIG. 2, the adjacent color filters are in contact with each other above the protrusion 121.

It should be noted that the solid-state imaging device 10 according to Embodiment 1 of the present invention is, for example, a solid-state imaging device arranged in a Bayer pattern in which the color filter 122a is a blue filter that transmits blue light at high rate in transmitted light intensity, the color filter 122b is a green filter that transmits green light at high rate in transmitted light intensity, and the color filter 122c is a red filter that transmits red light at high rate in transmitted light intensity. The color filters 122a to 122c are formed to correspond to the pixel units 100. In other words, a color filter is formed for each of the pixels.

The thickness of each color filter is 300 to 1000 nm and is greater than a height of the protrusion 121. The protrusion 121 includes a region including a silicon oxide. Alternatively, the protrusion 121 may be a cavity. It should be noted that, when the protrusion 121 is a cavity, the cavity can be formed by the manufacturing method shown in FIG. 5 and FIG. 6.

In this manner, the color filters 122a to 122c are buried between the protrusions 121. With the protrusion 121 which is a low-refractive index region and provided in the lower part between the color filters 122a to 122c, the oblique incident light which passes through the color filter is reflected off at the interface of the protrusion 121. In other words, a waveguide path configuration is formed. Thus, it is possible to reduce leakage (cross talk) of light into adjacent pixels, and achieve high sensitivity.

It should be noted that, in Embodiment 1 of the present invention, the refractive index of each of the color filters 122a to 122c is approximately 1.5 to 1.9; the refractive index of the protrusion 121 is approximately 1.4 when the protrusion 121 includes the silicon oxide film; and the refractive index of the protrusion 121 is approximately 1 when the protrusion 121 is the cavity. When the silicon oxide film is used for the protrusion 121, it is possible to achieve high sensitivity which is 20% greater than the conventional solid-state imaging device. Furthermore, when the cavity is used for the protrusion 121, it is possible to achieve high sensitivity which is 40% greater than the conventional solid-state imaging device.

Furthermore, by providing the color filters 122a to 122c above the protrusions 121, light other than the desired light is absorbed in the filter. Thus, flare due to irregular reflections at the interface between the solid-state imaging device and cover glass and lens that occurs due to return light reflected off the metal film 118 can be reduced. In particular, high effect is achieved on high intensity light, reducing the return light by 20% compared to the conventional solid-state imaging device.

It should be noted that, in Embodiment 1 of the present invention the color filters 122a to 122c are formed between the protrusions 121, above the first main surface opposite to the second main surface which is of the silicon layer 101 and is on the side on which the transistor 112 is formed. In contrast, even when the color filters 122a to 122c and the protrusions 121 are formed above (bottom surface of the insulating film 113 in FIG. 2) the multilayered wiring 114 on the side of the second main surface on which the transistor 112 is formed, the same advantageous effects can be obtained. However, due to the increase of light reflected off the multilayered wiring 114, it is possible to achieve high sensitivity which is greater by up to 10% than the conventional solid-state imaging device.

In addition, the solid-state imaging device 10 includes lenses 124 each of which is formed for a corresponding one of the pixels, above the color filters 122a to 122c. Specifically, lens 124 is formed above the color filters 122a to 122c via the planarization film 123. The planarization film 123 includes, for example, an organic matter. Providing the lens 124 makes it possible to collect a large amount of light and achieve high sensitivity which is 30% greater than the conventional solid-state imaging device. It should be noted that the solid-state imaging device 10 need not necessarily include the lens 124.

Next, a method of manufacturing the solid-state imaging device 10 according to Embodiment 1 of the present invention is described with reference to FIG. 3 and FIG. 4. It should be noted that each of FIGS. 3 and 4 is a cross-sectional view in each process showing an example of the method of manufacturing the solid-state imaging device 10 according to Embodiment 1 of the present invention.

Figure 3:
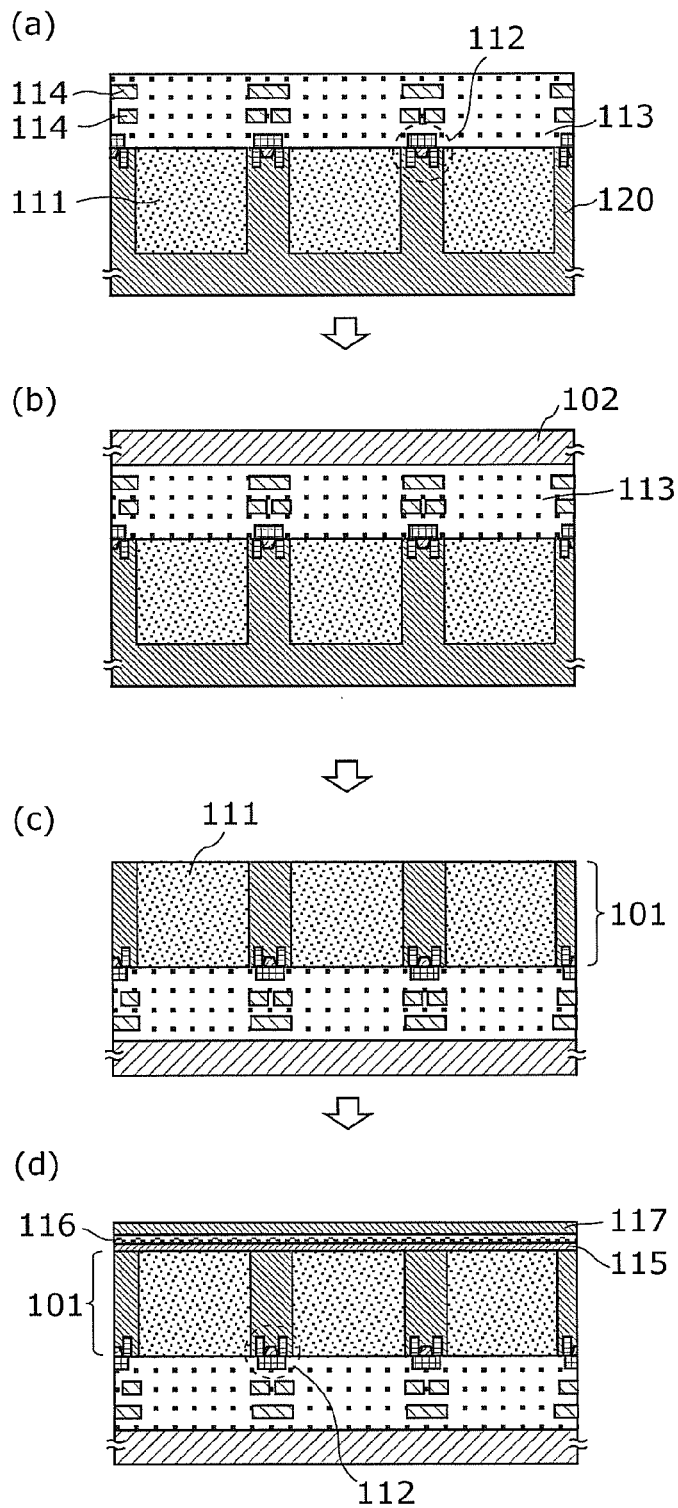
FIG. 3 is a cross-sectional view in each process showing an example of a method of manufacturing the solid-state imaging device according to Embodiment 1 of the present invention.
Figure 4:
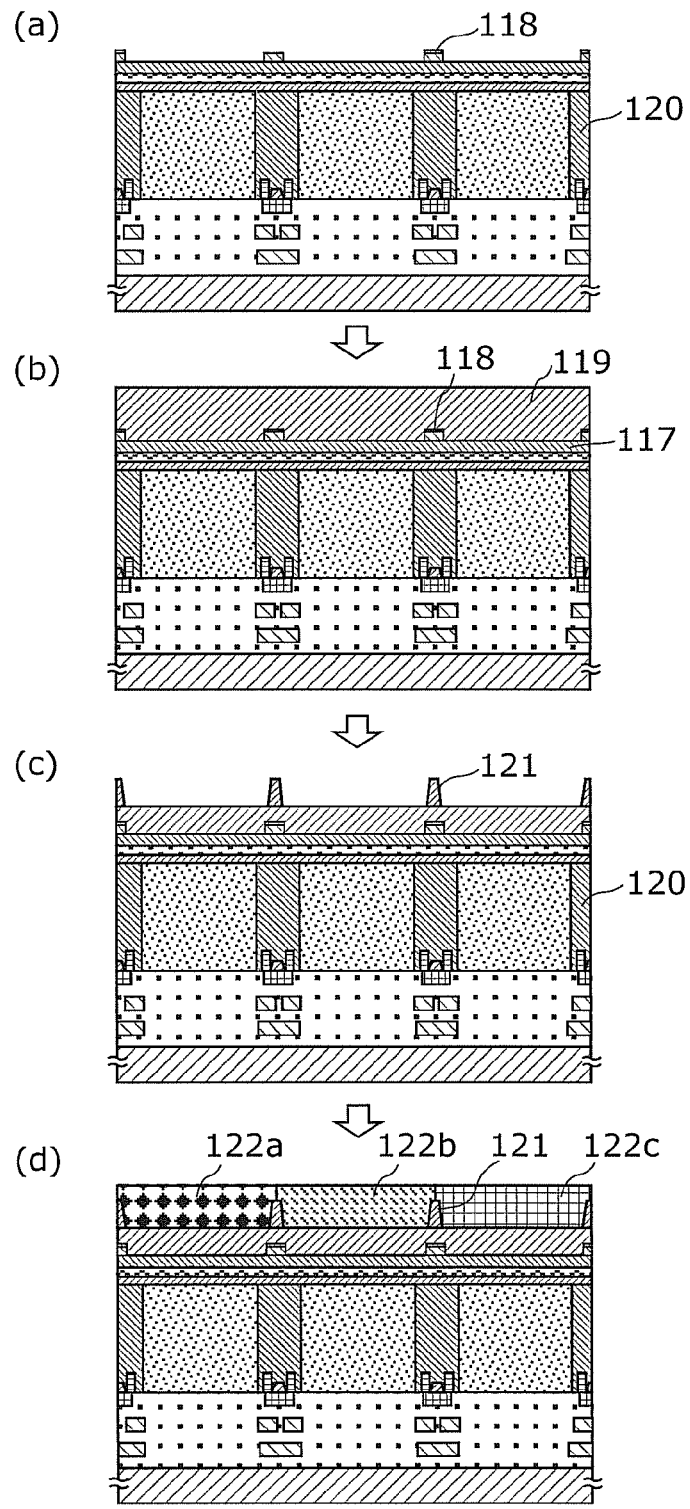
FIG. 4 is a cross-sectional view in each process showing an example of the method of manufacturing the solid-state imaging device according to Embodiment 1 of the present invention.

First, as shown in (a) of FIG. 3, the photodiode 111, the isolation region 120, various transistors including the transistor 112, the multilayer insulating film 113, and the multilayered wiring 114 are formed in a silicon substrate (including silicon on insulator (SIO) substrate) by an ordinary method of manufacturing a solid-state imaging device.

Subsequently, as shown in (b) of FIG. 3, a silicon substrate is bonded to, as the supporting substrate 102, the insulating film 113. In embodiments of the present invention, an adhesive (not shown) is used. It should be noted that the insulating film 113 may be planarized by a chemical mechanical polishing (CMP), have its surface activated in plasma, and be bonded to the supporting substrate 102.

Subsequently, as shown in (c) of FIG. 3, a thinning processing is performed on the silicon substrate in which the photodiode 111 is formed. For example, the thickness of the silicon substrate is 2 to 5 μm and the first main surface side of the silicon substrate is polished so that the photodiode 111 penetrates the silicon layer 101 from the surface to the back. At this time, the processing is performed up to a BOX layer (the silicon oxide film) of the SOI substrate, leaving the silicon layer 101 unprocessed.

Subsequently, as shown in (d) of FIG. 3, above the first main surface opposite to the second surface which is a surface of the silicon layer 101 and on which the transistor 112 is formed, the silicon oxide film 115, the silicon nitride film 116, and the silicon oxide film 117 are stacked. For example, the silicon oxide film 115, the silicon nitride film 116, and the silicon oxide film 117 are stacked by the chemical vapor deposition (CVD) method. The silicon nitride film 116 reduces reflection of the incident light occurring at the interface of the silicon layer 101.

Subsequently, as shown in (a) of FIG. 4, a metal film including tungsten is deposited with sputtering or a CVD method, and patterning is performed for the metal film by a lithography method. After the patterning, the metal film 118 is formed in a grid pattern above the isolation region 120 by a dry etching method. With this, it is possible to reduce oblique incident light which leaks into adjacent pixels and prevent the occurrence of color mixture. It should be noted that the width of the metal film 118 is approximately 0.4 μm.

Subsequently, as shown in (b) of FIG. 4, the insulating film 119 including a silicon oxide film is deposited by a CVD method or the like so as to cover the metal film 118 and the silicon oxide film 117. Subsequently, as shown in (c) of FIG. 4, after performing the patterning for the insulating film 119 by the lithography method, the protrusions 121 are formed in a grid pattern by a dry etching method above the isolation region 120.

Subsequently, as shown in (d) of FIG. 4, the color filters 122a to 122c are buried between the protrusions 121 so as to be arranged in a Bayer pattern. Furthermore, the color filters 122a to 122c are also arranged above the protrusions 121.

With this, the protrusion 121 having a lower refractive index than the color filters 122a to 122c is formed beside each of the color filters 122a to 122c, and thereby an optical waveguide is formed. Thus, it is possible to increase sensitivity. Furthermore, the color filters 122a to 122c are formed above the protrusions 121 and absorb the light reflected off the metal film 118. Thus, it is possible to reduce flare.

Subsequently, as shown in FIG. 2, the planarization film 123 is formed above the color filters 122a to 122c by spin-coating. Then, an organic film is applied on the planarization film 123 by spin-coating, and dry etching is performed for the organic film after patterning by the lithography method. The lenses 124 are thus formed.

With the above-described processes, the solid-state imaging device 10 shown in FIG. 2 can be manufactured.

As described above, the solid-state imaging device 10 according to Embodiment 1 of the present invention includes color filters formed above the semiconductor substrate to correspond to pixels. In a region on a side opposite to the semiconductor substrate between the adjacent color filters, each of the color filter is in contact with adjacent ones of the color filters, that is, for example, a region on a side where lens is formed. Furthermore, on a side of the semiconductor substrate in the region, a low-refractive index region having a lower refractive index than the color filter is formed.

With this, even when the oblique incident light is at a high incident angle, most of the oblique incident light is reflected off due to the difference in respective refractive indices at the boundary between a side surface of the color filter and the low-refractive index region. Therefore, the light which leaks into the adjacent pixels (cross talk) is reduced, and a large amount of light is collected. Thus, it is possible to achieve high sensitivity. Furthermore, above the low-refractive index region is covered by the color filter. Thus, even when the lens is formed above the low-refractive index region, variation in shape of the low-refractive index region between the color filters can be reduced. In addition, most of the light which reflected off the surface of the semiconductor substrate is absorbed by the color filter above the low-refractive index region between the color filters. Thus flare can be reduced, even when the light intensity is high.

Although the solid-state imaging device and the method of manufacturing the solid-state imaging device according to Embodiment 1 of the present invention have been described thus far, the present invention is not limited to these embodiments. The scope of the present invention includes various modifications to the embodiment that may be conceived by those skilled in the art, which do not depart from the essence of the present invention.

For example, as described above, the protrusion 121 which is an example of the low-refractive index region may be a cavity. The following describes with reference to FIGS. 5 and 6 an example of a method of manufacturing the solid-state imaging device 10 in which the protrusion 121 which is a cavity is formed. It should be noted that each of FIGS. 5 and 6 is a cross-sectional view in each process showing an example of a method of manufacturing the solid-state imaging device 10 according to a variation of Embodiment 1 of the present invention.

Figure 5:
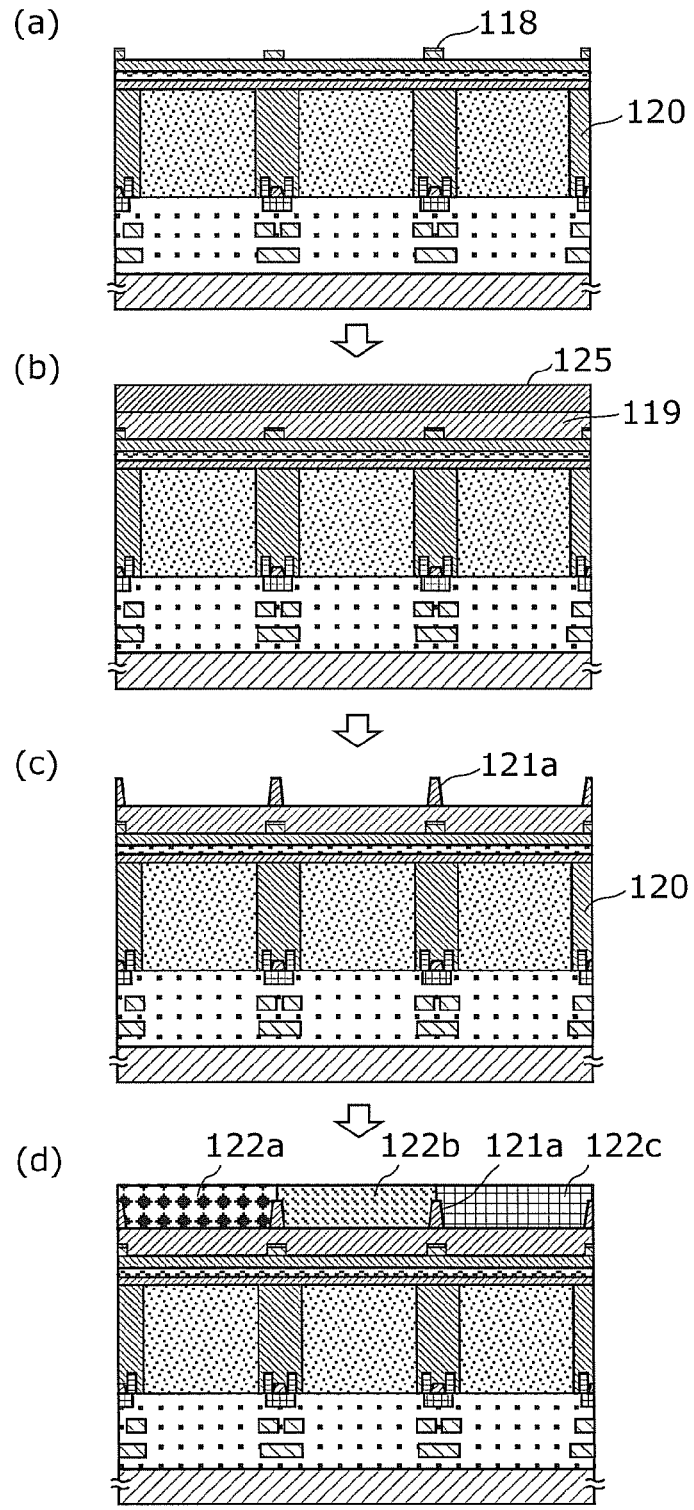
FIG. 5 is a cross-sectional view in each process showing an example of a method of manufacturing a solid-state imaging device according to a variation of Embodiment 1 of the present invention.
Figure 6:
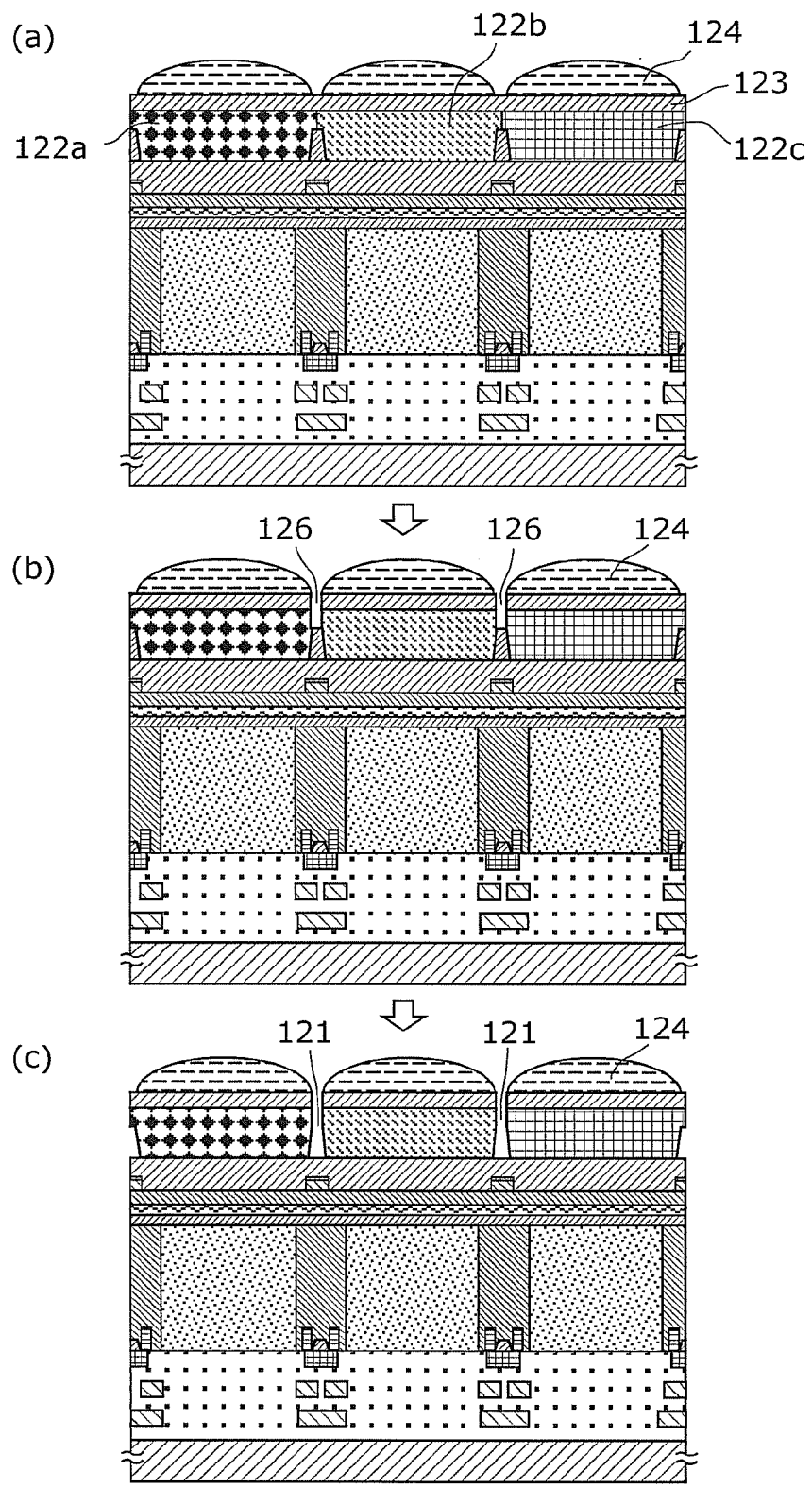
FIG. 6 is a cross-sectional view in each process showing an example of the method of manufacturing a solid-state imaging device according to the variation of Embodiment 1 of the present invention.

First, the process up to the formation of the metal film 118 shown in (a) of FIG. 5 is the same as the process shown in FIG. 3 and (a) of FIG. 4 described above. Subsequently, as shown in (b) of FIG. 5, the insulating film 119 which includes a silicon oxide film is deposited and, further, a silicon film 125 is formed to have a thickness of 100 to 500 nm with sputtering or the CVD method. It should be noted that the insulating film 119 has a thickness of 100 to 500 nm.

Subsequently, as shown in (c) of FIG. 5, after patterning the silicon film 125 by the lithography method, silicon protrusions 121a are formed in a grid pattern by the dry etching method above the isolation region 120.

Subsequently, as shown in (d) of FIG. 5, the color filters 122a to 122c are buried between the silicon protrusions 121a so as to be arranged in a Bayer pattern. Furthermore, the color filters 122a to 122c are also arranged above the silicon protrusions 121a.

Subsequently, as shown in (a) of FIG. 6, the planarization film 123 is formed above the color filters 122a to 122c by spin-coating. Then, an organic film is applied on the planarization film 123 by spin-coating, and dry etching is performed for the organic film after patterning by the lithography method. The lenses 124 are thus formed.

Subsequently, as shown in (b) of FIG. 6, a hole 126 which reaches the silicon protrusion 121a is formed in a portion between the lenses 124. In other words, the hole 126 is formed in a portion of a contact surface between the adjacent color filters or near the contact surface.

Subsequently, as shown in (c) of FIG. 6, a cavity is formed by removing the silicon protrusion 121a through exposure of the silicon protrusion 121a to a gas for removing silicon. Specifically, using a xenon fluoride (XeF) gas, an isotropic etching is performed and thereby the silicon protrusion 121a is removed. The protrusion 121 which is a cavity is thus formed.

With this, the protrusion 121 having a lower refractive index than the color filters 122a to 122c is formed beside the color filters 122a to 122c and thereby an optical waveguide is formed. Thus, it is possible to increase sensitivity. Furthermore, the protrusion 121 which is a cavity is formed after forming the planarization film 123 and the lens 124. Thus, the shape of the cavity is uniform, which makes it possible to reduce variations in sensitivity characteristic among the pixels to approximately a half as compared to the conventional solid-state imaging device.

Embodiment 2

A solid-state imaging device according to Embodiment 2 of the present invention is a solid-state imaging device in which a plurality of pixels are two-dimensionally arranged, and the solid-state imaging device includes: a plurality of color filters formed above a first main surface (light incidence surface) of the semiconductor substrate to correspond to the plurality of the pixels, wherein a low-refractive index region is formed in a region on a side of the semiconductor substrate between adjacent ones of the color filters, the low-refractive index region having a refractive index lower than refractive indices of the adjacent ones of the color filters and, each of the color filters is in contact with the adjacent ones of the color filters, above the low-refractive index region. Further, a light-blocking portion which blocks light is formed in the low-refractive index region.

First, a circuit configuration of the solid-state imaging device according to Embodiment 2 of the present invention is, for example, the same as FIG. 1. Therefore, here, description thereof is omitted.

Next, an example of a cross-sectional configuration of a pixel unit 200 included in the solid-state imaging device according to Embodiment 2 of the present invention is described with reference to FIG. 7.

Figure 7:
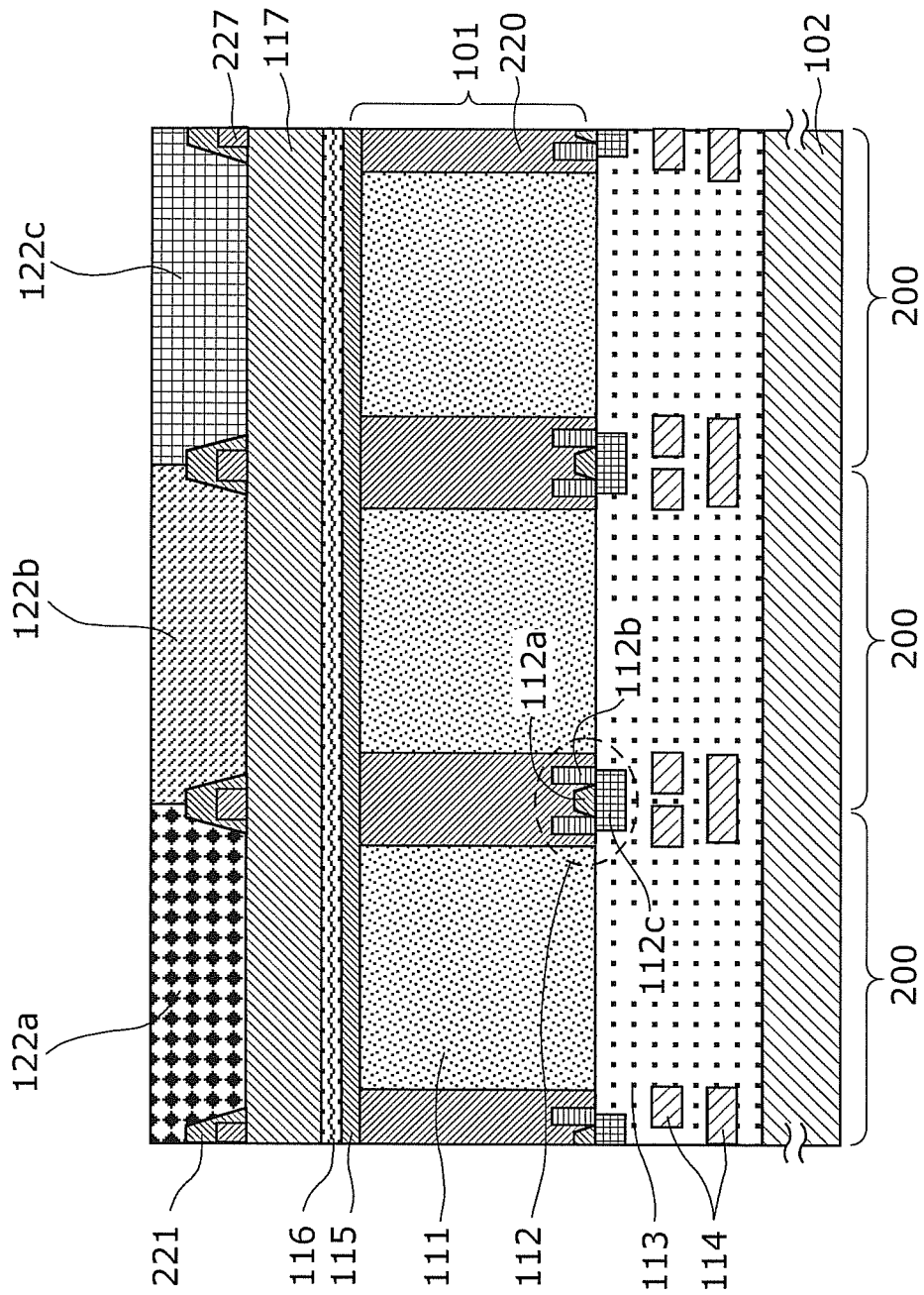
FIG. 7 is a cross-sectional view showing an example of a configuration of a pixel unit according to Embodiment 2 of the present invention.

FIG. 7 is a cross-sectional view showing an example of a structure of the pixel unit 200 according to Embodiment 2 of the present invention. It should be noted that, in FIG. 7, a component same as the component included in the configuration of the pixel unit 100 according to Embodiment 1 is assigned with the same reference sign. In the following, description on the point which is the same as the configuration of the pixel unit 100 according to Embodiment 1 is omitted, and mainly the points of difference is described.

The pixel unit 200 according to Embodiment 2 of the present invention is different from the pixel unit 100 according to Embodiment 1 in that the pixel unit 200 (i) does not include the metal film 118 and the insulating film 119, (ii) includes an isolation region 220 and a low-refractive index region 221 instead of the isolation region 120 and the protrusion 121, and (iii) newly includes a light-blocking portion 227.

The isolation region 220 is an example of an isolation portion which includes an impurity region of a different conductivity type than a photoelectric conversion unit (a photodiode 111). The isolation region 220 of p-type (second conductivity type) is formed between the adjacent photodiodes 111 in a set pattern. It should be noted that the photodiode 111 corresponds to the photoelectric conversion unit 11 shown in FIG. 1.

The low-refractive index region 221 is a region having a lower refractive index than color filters 122a to 122c. As shown in FIG. 7, the low-refractive index region 221 is formed in a region on the side of the semiconductor substrate between the adjacent color filters. Specifically, each of the color filters 122a to 122c is in contact with the adjacent ones of the color filters 122a to 122c in the corresponding area above the low-refractive index region 221.

Specifically, the low-refractive index regions 221 are arranged above the isolation regions 220 so as to be arranged in a form of a grid. Each of the low-refractive index regions 221 includes a silicon oxide film and has a height of 100 to 500 nm. Further, the color filters 122a to 122c are formed above the photodiodes 111 and are buried between the low-refractive index regions 221.

Furthermore, the color filters 122a to 122c cover the low-refractive index regions 221. Boundaries between the color filters 122a to 122c are provided above the low-refractive index regions 221. Specifically, above the corresponding one of the low-refractive index region, the adjacent ones of the color filters 122a to 122c are in contact with each other. Stated differently, in an upper region in a region including a boundary between the adjacent color filters, the color filters are in contact with each other.

Figure 10:
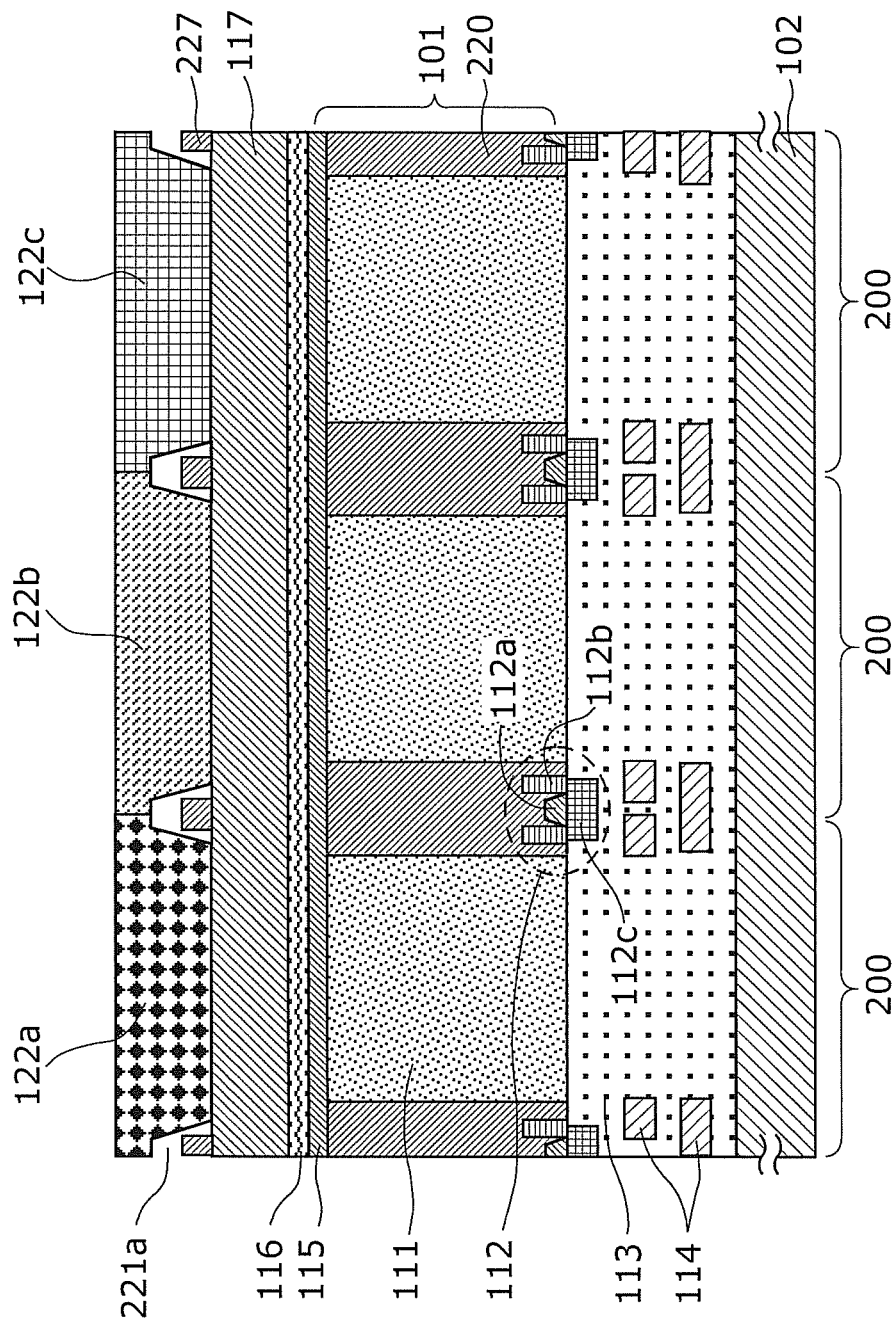
FIG. 10 is a cross-sectional view showing an example of a configuration of a solid-state imaging device according to the variation of Embodiment 2 of the present invention.
Figure 11:
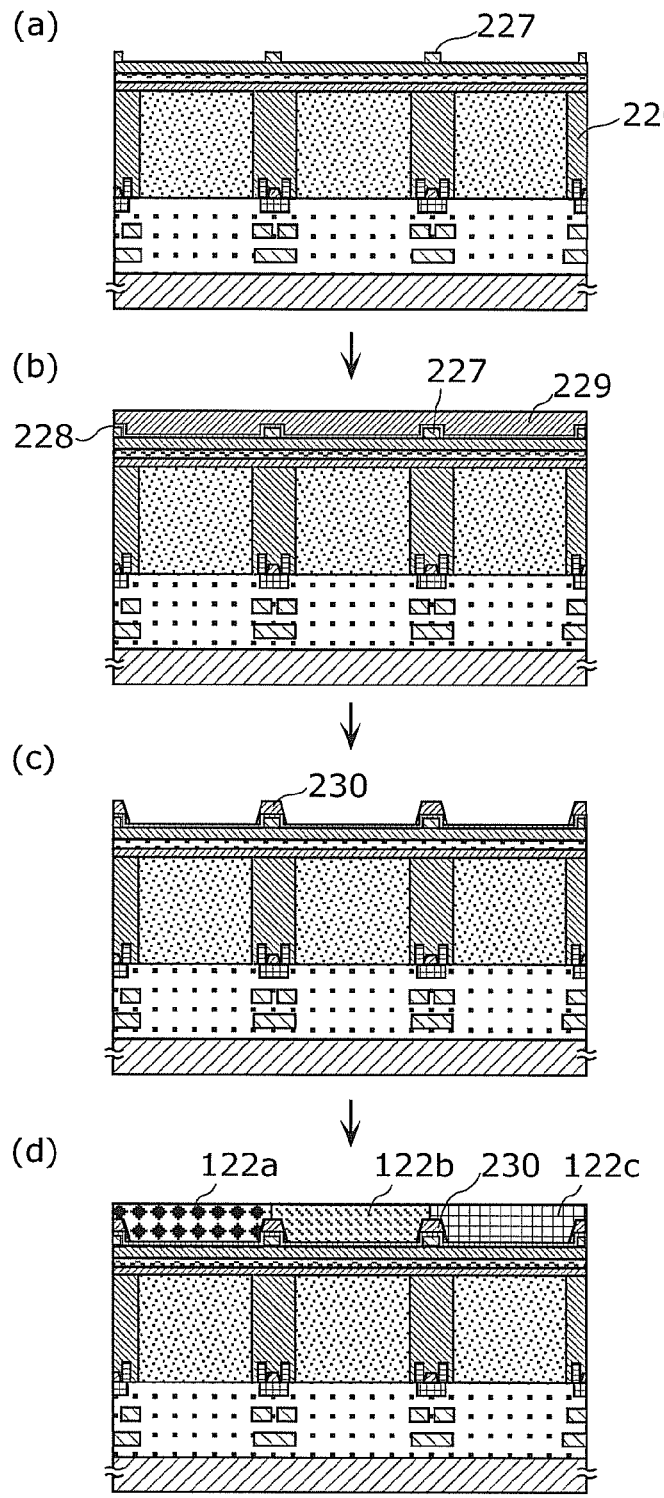
FIG. 11 is a cross-sectional view in each process showing an example of a method of manufacturing the solid-state imaging device according to the variation of Embodiment 2 of the present invention.
Figure 12:
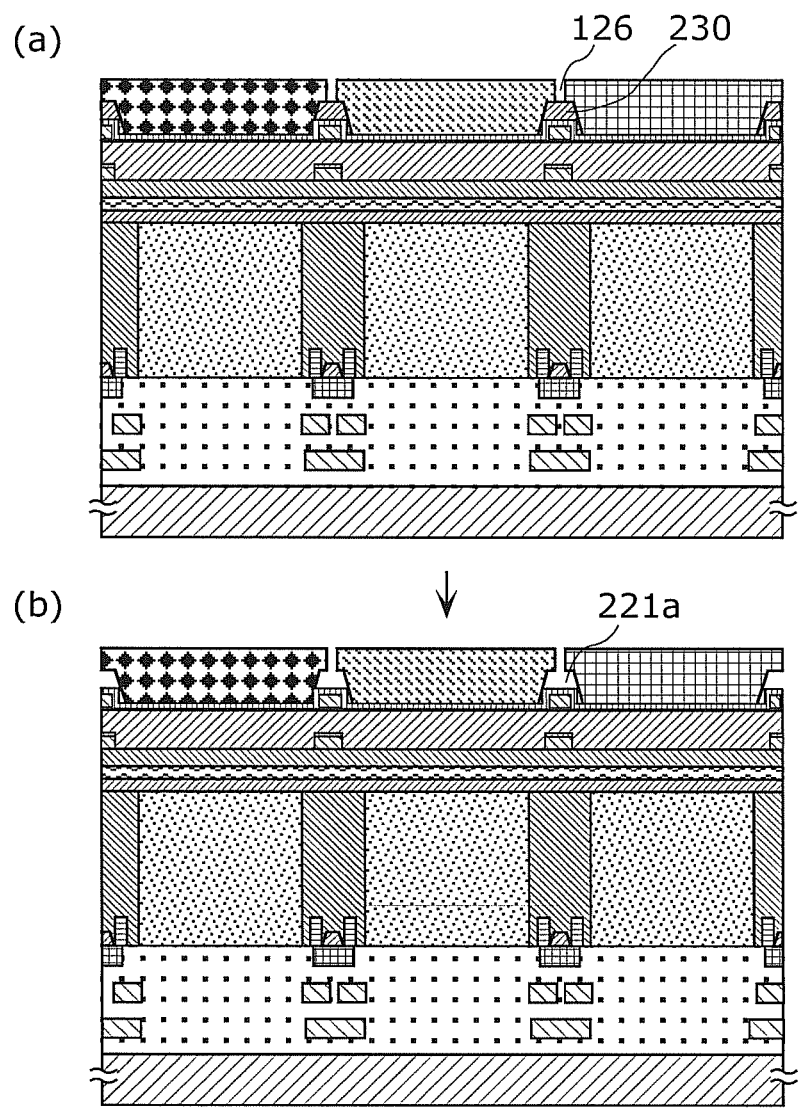
FIG. 12 is a cross-sectional view in each process showing an example of the method of manufacturing the solid-state imaging device according to the variation of Embodiment 2 of the present invention.
Figure 13:
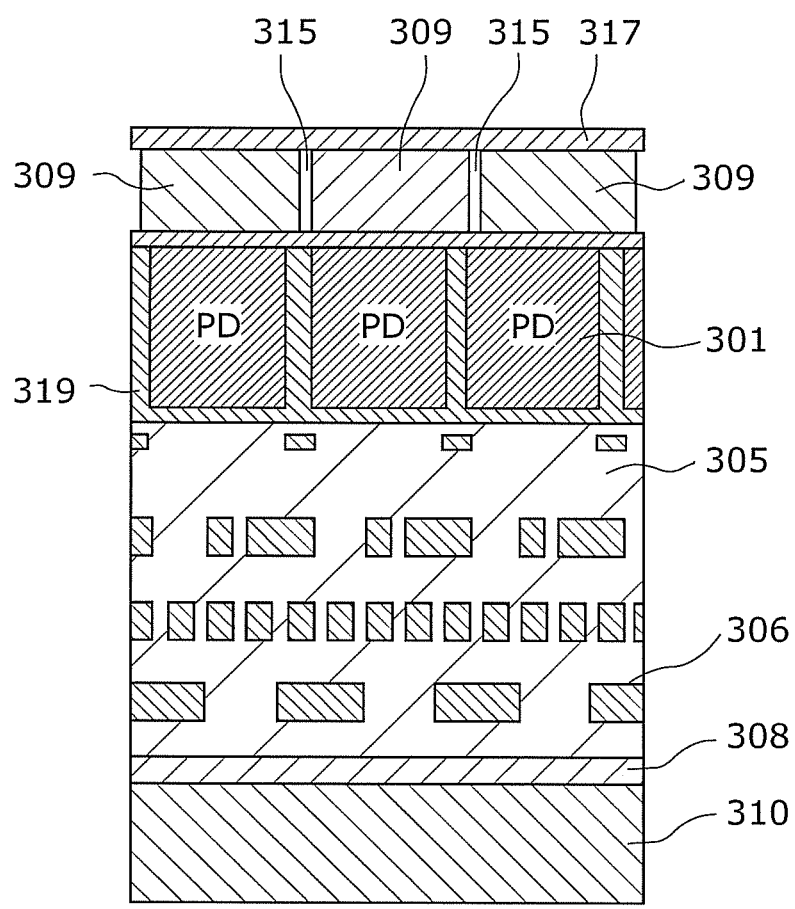
FIG. 13 is a cross-sectional view showing a configuration of a conventional solid-state imaging device.

It should be noted that a similar advantageous effect can be obtained even when the low-refractive index region 221 is a cavity, which can be realized by the manufacturing method shown in FIG. 11 and FIG. 12. The configuration in which the low-refractive index region 221 is a cavity is described later with reference to FIG. 10.

In this manner, the color filters 122a to 122c are buried between the low-refractive index regions 221. In other words, the low-refractive index regions 221 are arranged between the color filters 122a to 122c in a lower part of the color filters 122a to 122c. With this, oblique incident light which is transmitted through the color filters 122a to 122c reflects off at the interface of the low-refractive index region 221. In other words, a waveguide path is formed. Thus, it is possible to reduce leakage (cross talk) of light into adjacent pixels, and achieve high sensitivity.

It should be noted that, in Embodiment 2 of the present invention, the refractive index of the color filters 122a to 122c is approximately 1.5 to 2.0, and the refractive index of the low-refractive index region 221 is approximately 1.4 when the low-refractive index region 221 includes the silicon oxide film. When a silicon oxide film is used for the low-refractive index region 221, in terms of sensitivity of the photodiode 111 above which the color filter 122c, which transmits red light (wavelength 650 nm) at a high rate is formed, it is possible to achieve high sensitivity which is 25% greater than the conventional device (i.e., the solid-state imaging device in which color filters are arranged without low-refractive index regions below the multilayered wiring 114).

In addition, in Embodiment 2 of the present invention, the light-blocking portion 227 is formed in the low-refractive index region 221. Thus, the distances between the photodiodes 111 and the color filters 122a to 122c are reduced to be shorter by 20% compared to the conventional solid-state imaging device.

Furthermore, by covering the low-refractive index region 221 with the color filters 122a to 122c, the reflection light from the silicon layer 101 and the light-blocking portion 227 can be absorbed by the color filters 122a to 122c. Thus, flare due to irregular reflections at the interface between the solid-state imaging device and a cover glass or a lens provided above the solid-state imaging device can be reduced. The degree of reduction of reflected light depends on the thickness of the color filters 122a to 122c formed above the low-refractive index regions 221. For example, when the thickness of the light-blocking portion 227 is 200 nm, the reflected light can be reduced by 30% compared to the conventional solid-state imaging device.

As described above, in the low-refractive index region 221, the light-blocking portion 227 which is an example of the first light-blocking portion that obstructs incident light from entering the silicon layer 101 is formed. The light-blocking portion 227 in this embodiment includes a metal film. For example, a tungsten material which has a high light blocking capability as a thin layer is formed to have a thickness of 200 to 500 nm. It should be noted that aluminum, copper, titanium or the like may be formed to have the thickness of 200 to 500 nm and used as the light-blocking portion 227.

With this, it is possible to obstruct incident light, which leaks into the low-refractive index region 221 from the color filter, from reaching the semiconductor substrate. Thus, it is possible to further reduce light which leaks into the adjacent pixels. Thus, it is possible to achieve high sensitivity.

It should be noted that, in Embodiment 2 of the present invention, above the first main surface that is located opposite to the second main surface, which is of a surface of the silicon layer 101 and is the side on which the transistor 112 is formed, a corresponding one of the color filters 122a to 122c is formed between the low-refractive index regions 221. In contrast, a similar advantageous effect can be obtained by forming the color filters 122a to 122c and the low-refractive index regions 221 above (bottom surface of the insulating film 113 in FIG. 7) the multilayered wiring 114 on the side of the second main surface on which the transistor 112 is formed.

Specifically, a detection circuit which includes the multilayered wiring 114 and the like, and the color filters 122a to 122c may be formed on the same side of the surface with respect to the semiconductor substrate. Stated differently, the detection circuit may be formed above the semiconductor substrate, which is a surface on the side through which the light enters. However, due to the increase of light reflected off the multilayered wiring 114, in terms of the sensitivity of the photodiode 111 above which the color filter 122c which transmits red light (wavelength 650 nm) at a high rate is formed, it is possible to achieve high sensitivity which is greater by up to 10% than conventional solid-state imaging device.

Figure 8:
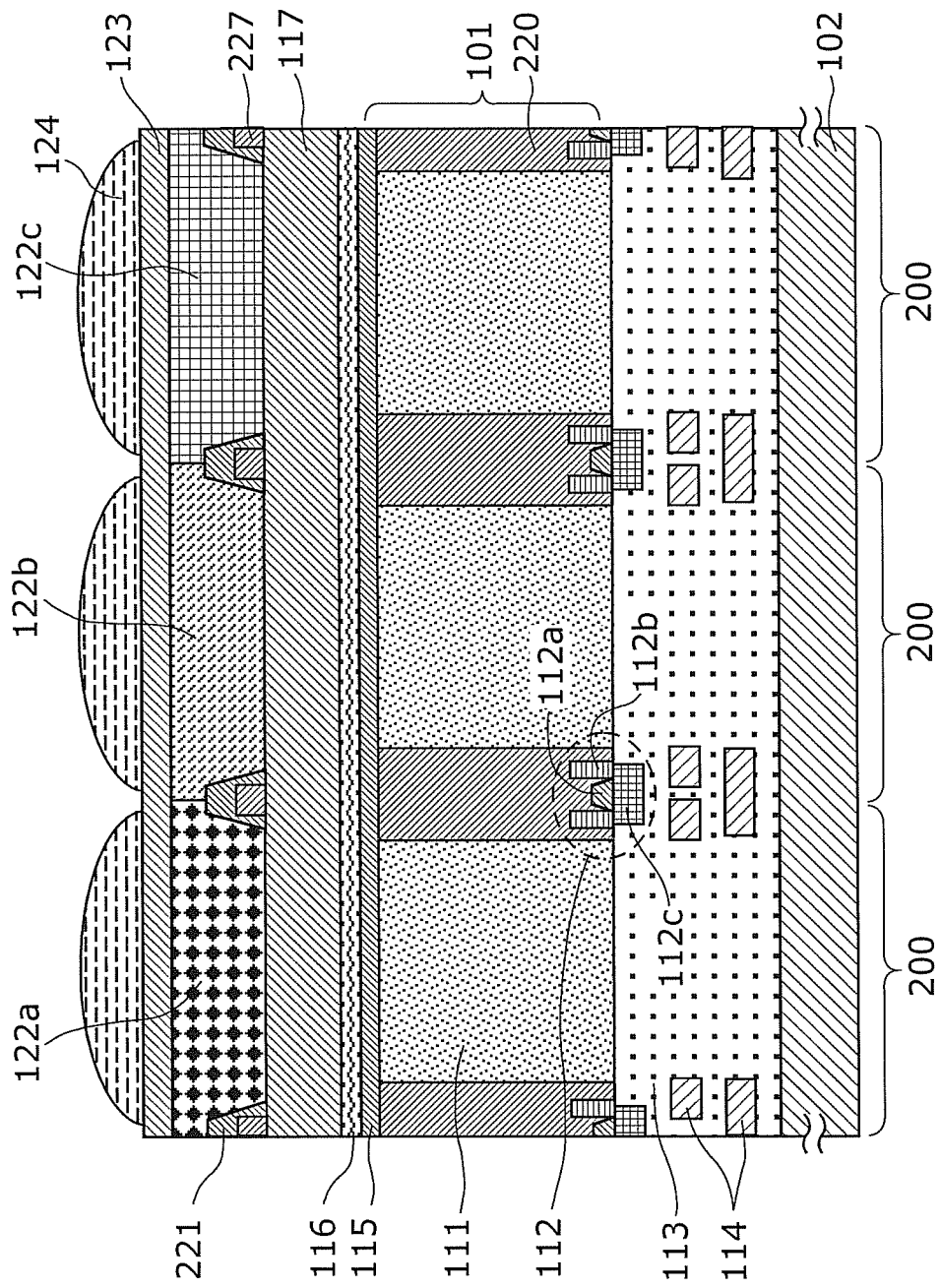
FIG. 8 is a cross-sectional view showing an example of a configuration of a pixel unit according to a variation of Embodiment 2 of the present invention.

Subsequently, as shown in FIG. 8, the lens 124 may be formed above the color filters 122a to 122c and on the planarization film 123. Specifically, the solid-state imaging device according to Embodiment 2 of the present invention may include, above the color filters 122a to 122c, a plurality of the lenses 124 formed to correspond to the pixel units 200. This structure makes it possible to collect even greater amount of light. When the low-refractive index region 221 includes the silicon oxide film, the sensitivity of the photodiode 111 above which the color filter 122c that transmits red light (wavelength 650 nm) at a high rate is formed can be increased by 30% than the conventional solid-state imaging device.

Figure 9:
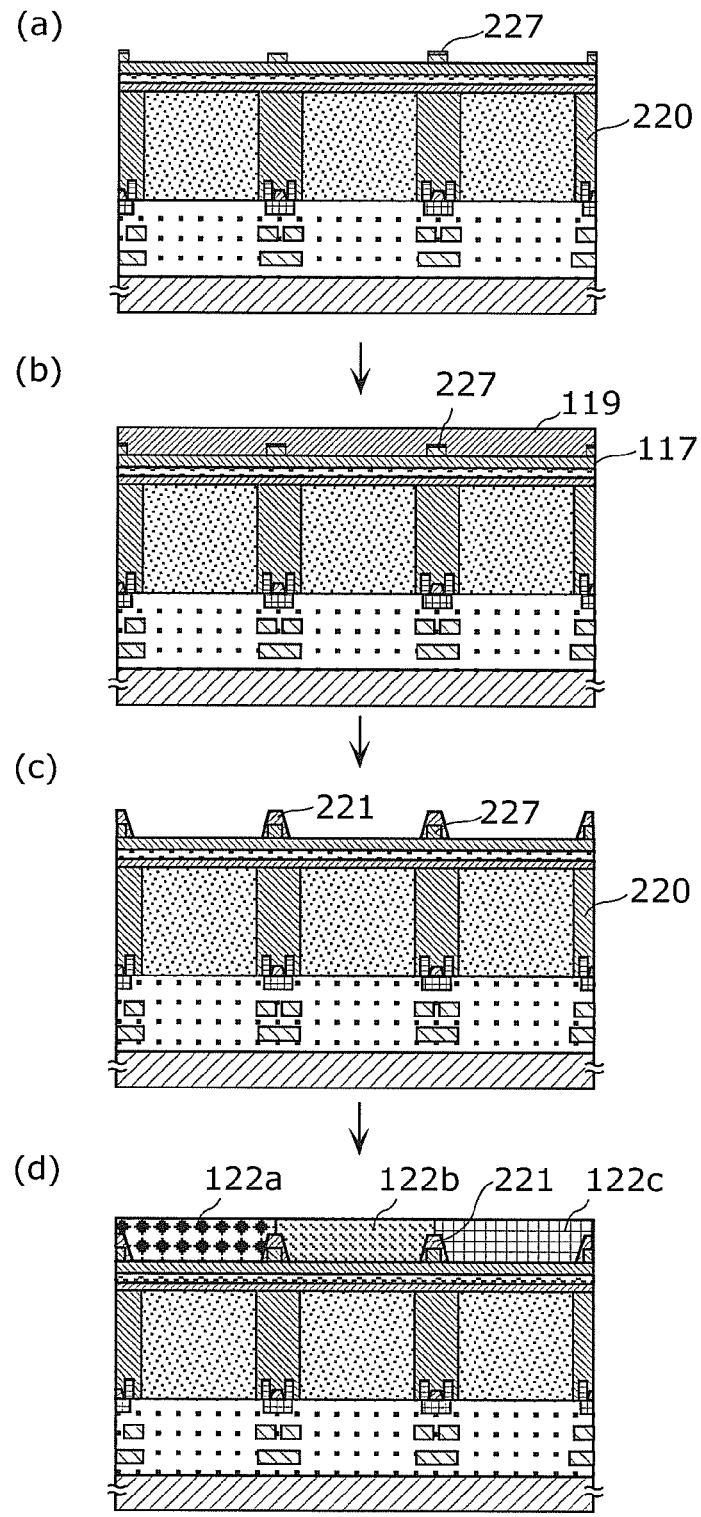
FIG. 9 is a cross-sectional view in each process showing an example of a method of manufacturing a solid-state imaging device according to Embodiment 2 of the present invention.

Next, a method of manufacturing the solid-state imaging device according to Embodiment 2 of the present invention is described with reference to FIG. 3 and FIG. 9. It should be noted that the method of manufacturing the solid-state imaging device according to Embodiment 2 of the present invention has the same process as the method of manufacturing the solid-state imaging device according to Embodiment 1 up to the formation of the silicon oxide film 117 (FIG. 3). Therefore, in the below, description on the process shown in FIG. 3 is omitted. It should be noted that FIG. 9 is a cross-sectional view in each process showing an example of the method of manufacturing the solid-state imaging device according to Embodiment 2 of the present invention.

After forming the silicon oxide film 117, the light-blocking portion 227 is formed in a region including at least part of the boundary between the pixels. Specifically, as shown in (a) of FIG. 9, a metal film including tungsten is deposited with sputtering or a CVD method, and patterning is performed for the metal film with a lithography method. After the patterning, the light-blocking portion 227 is formed above the isolation region 220 with a dry etching method.

In this embodiment, it is assumed that the light-blocking portions 227 are formed in a grid, on a surface above the silicon oxide film 117. This is because the light-blocking portions 227 are formed so as to be arranged on a perimeter of the color filters arranged in a matrix array. However, the arrangement is not limited to the grid, and it is sufficient that the light-blocking portions 227 be formed in a periphery of the border between the adjacent color filters. With this, it is possible to reduce oblique incident light which leaks into the adjacent pixels.

It should be noted that the light-blocking portion 227 is formed to have a width smaller than a width of the isolation region 220 so as not to be disposed above the photodiode 111. It should be noted that, in this embodiment, the width of the light-blocking portion 227 is approximately 0.3 μm.

Subsequently, as shown in (b) of FIG. 9, the insulating film 119 which includes a silicon oxide film is deposited with a CVD method or the like so as to cover the light-blocking portion 227 and the silicon oxide film 117.

Subsequently, as shown in (c) of FIG. 9, after performing the patterning for the insulating film 119 with the lithography method, the low-refractive index regions 221 are formed in a grid pattern above the isolation region 220 with a dry etching method. As with the pattern of the light-blocking portion 227, the low-refractive index region 221 is formed to have a width smaller than the width of the isolation region 220 so as not to be disposed above the photodiode 111.

Specifically, compared with the width of the surface of the isolation region 220 on the side of the color filter, that is, the surface on the side of the light incidence surface, the width of the surface of the low-refractive index region 221 on the side of the semiconductor substrate is smaller. It should be noted that, for example, the cross-sectional shape of the low-refractive index region 221 is substantially a rectangular shape, a trapezoidal shape, or a triangular shape.

Subsequently, as shown in (d) of FIG. 9, the color filters 122a to 122c are buried between the low-refractive index regions so as to be arranged in a Bayer pattern. Furthermore, the color filters 122a to 122c are also arranged above the low-refractive index regions 221. With this, the low-refractive index regions 221 having lower refractive indices than the color filters 122*a* to 122*c* are formed beside the color filters 122*a* to 122*c*. With this, an optical waveguide which allows the oblique incident light to reflect off at the interface of the low-refractive index region 221 is formed. Thus, it is possible to achieve high sensitivity. Furthermore, the color filters 122*a* to 122*c* are formed above the low-refractive index regions 221 and thus light reflected off the silicon layer 101 and the light-blocking portion 227 is absorbed. Thus, it is possible to reduce flare.

With the above-described processes, the solid-state imaging device shown in FIG. 7 can be manufactured.

As described above, the solid-state imaging device according to Embodiment 2 of the present invention includes, above the semiconductor substrate, the color filters 122*a* to 122*c* which are formed to correspond to the pixels. In addition, in a region on the side opposite to the semiconductor substrate between the adjacent color filters, that is, for example a region on a side on which the lens 124 is formed, each of the color filters 122*a* to 122*c* is in contact with the adjacent color filter. Furthermore, the low-refractive index region 221 having a lower refractive index than the color filter is formed in a region between the adjacent color filters and on the side of the semiconductor substrate. Further, the light-blocking portion 227 is formed in the low-refractive index region 221.

With this, even when the oblique incident light is at a high incident angle, most of the light is reflected off due to the difference in respective refractive indices at the boundary between a side surface of the color filters 122*a* to 122*c* and the low-refractive index regions 221. Therefore, the leakage of light into the adjacent pixels (cross talk) is reduced, and a large amount of light is collected. Thus, it is possible to achieve high sensitivity.

Furthermore, since above the low-refractive index region 221 is covered by the color filters 122*a* to 122*c*, it is possible to reduce variations in shape of the low-refractive index regions 221 which are formed between the color filters 122*a* to 122*c*, even when the lens 124 is formed above the low-refractive index region 221. In addition, most of the reflected light is absorbed by the color filters above the low-refractive index regions 221 which are formed between the color filters 122*a* to 122*c*. Thus, even when the light intensity is high, flare can be reduced. In addition, since the light-blocking portion 227 is included in the low-refractive index region 221, the distance between the color filters 122*a* to 122*c* and the silicon layer 101 can be reduced. Thus, high sensitivity can be realized.

Although the solid-state imaging devices and the methods of manufacturing the solid-state imaging device according to Embodiment 2 of the present invention have been described thus far, the present invention is not limited to these embodiments. The scope of the present invention includes various modifications to the embodiment that may be conceived by those skilled in the art, which do not depart from the essence of the present invention.

For example, as described above, the low-refractive index region between the color filters may be a cavity. FIG. 10 is a cross-sectional view showing an example of a configuration of the solid-state imaging device according to the variation of Embodiment 2 of the present invention.

As shown in FIG. 10, in a region on the side of the semiconductor substrate between adjacent ones of the color filters 122*a* to 122*c*, a cavity 221*a* is formed as the low-refractive index region. In addition, the light-blocking portion 227 for blocking light is formed in the cavity 221*a*. The adjacent color filters 122*a* to 122*c* are in contact with each other in a region above the cavity 221*a*.

The refractive index of the cavity 221*a* is approximately 1. When the cavity 221*a* is formed as the low-refractive index region, the photodiode 111 above which the color filter 122*c* that mainly transmits red light (wavelength 650 nm) is formed can achieve high sensitivity which is 45% greater than the conventional solid-state imaging device.

The following describes with reference to FIG. 11 and FIG. 12 an example of a method of manufacturing the solid-state imaging device in which the cavity 221*a* is formed as the low-refractive index region. It should be noted that each of FIGS. 11 and 12 is a cross-sectional view in each process showing an example of a method of manufacturing the solid-state imaging device according to the variation of Embodiment 2 of the present invention.

First, the process up to the formation of the light-blocking portion 227 shown in (a) of FIG. 11 is the same as the process shown in FIG. 3 and (a) of FIG. 9 described above.

Subsequently, as shown in (b) of FIG. 11, an insulating film 228 including the silicon oxide film is deposited to have a thickness of 10 to 30 nm, and, further, a silicon film 229 is formed to have a thickness of 100 to 500 nm with sputtering or the CVD method.

Subsequently, as shown in (c) of FIG. 11, after patterning the silicon film 229 with the lithography method, silicon protrusions 230 are formed in a grid pattern above the isolation regions 220 with the dry etching method.

Subsequently, as shown in (d) of FIG. 11, the color filters 122*a* to 122*c* are buried between the silicon protrusions 230 so as to be arranged in a Bayer pattern. Furthermore, the color filters 122*a* to 122*c* are also arranged above the silicon protrusions 230.

Subsequently, as shown in (a) of FIG. 12, in the boundary regions between the color filters 122*a* to 122*c*, spaces which reach the silicon protrusions 230 are formed with dry etching after performing the patterning with the lithography method. In other words, the hole 126 is formed in a portion of the contact surface between the adjacent color filters or near the contact surface. The holes 126 penetrate the color filters 122*a* to 122*c* to reach the silicon protrusions 230. It should be noted that the hole 126 may be formed with the lithography in the boundary region between the pixels at the time when the color filter shown in (d) of FIG. 11 is buried.

Subsequently, as shown in (b) of FIG. 12, the silicon protrusion 230 is removed by an isotropic etching using xenon fluoride (XeF) gas which is an example of gas that is used to remove silicon. With this, the cavity 221*a* is formed as the low-refractive index region.

Thus, the low-refractive index regions 221 or the cavities 221*a* having lower refractive indices than the color filters 122*a* to 122*c* are formed beside the color filters 122*a* to 122*c* and thereby optical waveguides are formed. Thus, it is possible to increase sensitivity.

Furthermore, the photodiode 111 may be a photodiode including a p-type diffusion region. In this case, it should be noted that the isolation region 220 is an n-type isolation region.

Although the solid-state imaging device and the method of manufacturing the solid-state imaging device have been described thus far based on embodiments, the present invention is not limited to these embodiments. The scope of the present invention includes various modifications to the embodiment that may be conceived by those skilled in the art and embodiments resulting from arbitrary combinations of components of different embodiments which do not depart from the essence of the present invention.

For example, the methods of forming the low refractive index material and the cavity, which are the low-refractive index regions, is not limited to the above but may be formed using another method.

While the corners and sides of each component are drawn linearly in the drawings (e.g. FIG. 2) used for describing the above Embodiments, components with round corners and sides for manufacturing reasons are also encompassed by the present invention.

All the numbers used above are examples to specifically describe the present invention, and the present invention is not limited to the numbers described as examples. Furthermore, n-type, p-type, and the like of the transistor and the like are examples to specifically describe the present invention, and it is also possible to obtain an equivalent result by reversing these. The materials of the components described above are all examples to specifically describe the present invention, and the present invention is not limited to the materials described as examples. Furthermore, the connection relationship between components is an example to specifically describe the present invention, and the connection relationship which realizes the function of the present invention is not limited to such an example.

Furthermore, the configurations of the solid-state imaging device described above are examples to specifically describe the present invention, and the solid-state imaging device according to the present invention need not necessarily include all of the components described above. Stated differently, it is sufficient that the solid-state imaging device according to the present invention include minimum components which make it possible to realize the advantageous effects of the present invention.

In the same manner, the methods of manufacturing the solid-state imaging device described above are examples to specifically describe the present invention, and the method of manufacturing the solid-state imaging device according to the present invention need not necessarily include all of the process described above. Stated differently, it is sufficient that the method of manufacturing the solid-state imaging device according to the present invention include minimum process which makes it possible to realize the advantageous effects of the present invention. Furthermore, the sequence of performing the process described above is an example to specifically describe the present invention, and the sequence different form the above description is also acceptable. Furthermore, part of the above-described process may be performed at the same time (concurrently) as another process.

The solid-state imaging device according to the present invention produces advantageous effects of achieving high sensitivity, reducing color mixture, and increasing picture quality even when a size of a pixel is miniaturized, and can be used for, for example, an imaging device such as a digital camera.

The invention claimed is:

1. A solid-state imaging device in which a plurality of pixels are two-dimensionally arranged, the solid-state imaging device comprising:
   a semiconductor substrate;
   a plurality of photoelectric conversion units formed in the semiconductor substrate to correspond to the plurality of pixels and configured to generate signal charges by performing photoelectric conversion on incident light; and
   a plurality of color filters formed above the semiconductor substrate to correspond to the plurality of the pixels,
   wherein a low-refractive index region is formed in a region on a side of the semiconductor substrate between adjacent ones of the color filters and above a first insulating film, the low-refractive index region having a refractive index lower than refractive indices of the adjacent ones of the color filters,
   a first light-blocking portion disposed above the first insulating film and between the low-refractive index region and the semiconductor substrate,
   a second light-blocking portion disposed below the first insulating film and separated from the first light-blocking portion, the second light-blocking portion also being disposed between the low-refractive index region and the semiconductor substrate,
   each of the color filters is in contact with the adjacent ones of the color filters, above the low-refractive index region,
   the first insulating film includes a silicon oxide,
   a lower boundary of the first light-blocking portion, a lower boundary of the low-refractive index region and a lower boundary of the plurality of color filters are in direct contact with the first insulating film, and
   a thickness of each of the color filters is 300 to 1000 nm.

2. The solid-state imaging device according to claim 1, wherein the low-refractive index region is a cavity or a region including a material which has a refractive index lower than the refractive indices of the adjacent ones of the color filters.

3. The solid-state imaging device according to claim 2, wherein the low-refractive index region includes a silicon oxide which has a refractive index lower than the refractive indices of the adjacent ones of the color filters.

4. The solid-state imaging device according to claim 1, wherein the second light-blocking portion includes at least one of tungsten, aluminum, copper, or titanium.

5. The solid-state imaging device according to claim 4, further comprising
an isolation portion which is formed between the photoelectric conversion units and includes a plurality of impurity regions of a conductivity type different from a conductivity type of the plurality of photoelectric conversion units,
wherein a width of a surface of the low-refractive index region on a side of the semiconductor substrate is smaller than a width of a surface of the isolation portion on a side of the color filters.

6. The solid-state imaging device according to claim 1, further comprising
a high-refractive index film which is formed between the low-refractive index region and the semiconductor substrate and has a refractive index higher than the refractive indices of the adjacent ones of the color filters.

7. The solid-state imaging device according to claim 6, wherein the high-refractive index film includes at least one of a titanium oxide, a silicon nitride, or a tantalum oxide.

8. The solid-state imaging device according to claim 7, further comprising
a plurality of lenses formed above the color filters to correspond to the plurality of pixels.

9. The solid-state imaging device according to claim 8, further comprising
detection circuits which are formed below the semiconductor substrate and detect the signal charges generated by the plurality of photoelectric conversion units.

10. The solid-state imaging device according to claim 6, wherein the high-refractive index film is disposed between the first light-blocking portion and the semiconductor substrate.

11. The solid-state imaging device according to claim 1, further comprising an isolation portion which is formed between the photoelectric conversion units and includes a plurality of impurity regions of a conductivity type different from a conductivity type of the plurality of photoelectric conversion units, wherein a width of a surface of the low-refractive index region on a side of the semiconductor substrate is smaller than a width of a surface of the isolation portion on a side of the color filters.

12. The solid-state imaging device according to claim 1, further comprising a plurality of lenses formed above the color filters to correspond to the plurality of pixels.

13. The solid-state imaging device according to claim 1, further comprising detection circuits which are formed below the semiconductor substrate and detect the signal charges generated by the plurality of photoelectric conversion units.

14. The solid-state imaging device according to claim 1, a thickness of the first light-blocking portion is 200 to 500 nm.

15. The solid-state imaging device according to claim 1, wherein the first light-blocking portion includes at least one of tungsten, aluminum, or copper.

16. A solid-state imaging device in which a plurality of pixels are two-dimensionally arranged, the solid-state imaging device comprising:

a semiconductor substrate;

a plurality of photoelectric conversion units formed in the semiconductor substrate to correspond to the plurality of pixels and configured to generate signal charges by performing photoelectric conversion on incident light;

a first insulating film disposed above the semiconductor substrate;

a first light-blocking portion disposed on the first insulating film;

a plurality of color filters formed on the first insulating film to correspond to the plurality of the pixels, a low-refractive index region disposed between adjacent ones of the plurality of color filters and on the first insulating film, the low-refractive index region having a refractive index lower than refractive indices of the adjacent ones of the color filters, the low-refractive index region covering the first light-blocking portion, wherein a lower boundary of the first light-blocking portion, a lower boundary of the low-refractive index region and a lower boundary of the plurality of color filters are in direct contact with the first insulating film, and a thickness of each of the color filters is 300 to 1000 nm.

17. The solid-state imaging device according to claim 16, wherein the first insulating film includes a silicon oxide.

* * * * *